(12) United States Patent
Jun et al.

(10) Patent No.: US 11,935,873 B2
(45) Date of Patent: Mar. 19, 2024

(54) METHODS OF INSPECTION OF SEMICONDUCTOR PACKAGES INCLUDING MEASUREMENT OF ALIGNMENT ACCURACY AMONG SEMICONDUCTOR CHIPS

(71) Applicant: Samsung Electronics Co., Ltd., Suwon-si (KR)

(72) Inventors: Joonho Jun, Cheonan-si (KR); Un-Byoung Kang, Hwaseong-si (KR); Sunkyoung Seo, Cheonan-si (KR); Jongho Lee, Hwaseong-si (KR); Young Kun Jee, Hwaseong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 18/176,058

(22) Filed: Feb. 28, 2023

(65) Prior Publication Data

US 2023/0207532 A1 Jun. 29, 2023

Related U.S. Application Data

(63) Continuation of application No. 17/571,796, filed on Jan. 10, 2022, now Pat. No. 11,621,250, which is a (Continued)

(30) Foreign Application Priority Data

Dec. 13, 2019 (KR) ........................ 10-2019-0167005

(51) Int. Cl.
*H01L 25/065* (2023.01)
*H01L 23/00* (2006.01)

(52) U.S. Cl.
CPC .......... *H01L 25/0657* (2013.01); *H01L 24/06* (2013.01); *H01L 24/14* (2013.01);
(Continued)

(58) Field of Classification Search
CPC ....... H01L 25/0657; H01L 2224/16145; H01L 24/14; H01L 2224/0401;
(Continued)

(56) References Cited

U.S. PATENT DOCUMENTS 9,018,969 B2 4/2015 Ishikawa et al.
9,721,916 B2 8/2017 Cheng et al.
(Continued)

FOREIGN PATENT DOCUMENTS

JP 2003-195249 A 7/2003
JP 5549339 B2 7/2014
(Continued)

*Primary Examiner* — Didarul A Mazumder
(74) *Attorney, Agent, or Firm* — Harness, Dickey & Pierce, P.L.C.

(57) ABSTRACT

A semiconductor package may include first and second substrates, which are vertically stacked, a semiconductor device layer on a bottom surface of the second substrate to face a top surface of the first substrate, upper chip pads and an upper dummy pad on the top surface of the first substrate, penetration electrodes, which each penetrate the first substrate and are connected to separate, respective upper chip pads, lower chip pads on a bottom surface of the semiconductor device layer and electrically connected to separate, respective upper chip pads, and a lower dummy pad on the bottom surface of the semiconductor device layer and electrically isolated from the upper dummy pad. A distance between the upper and lower dummy pads in a horizontal direction that is parallel to the first substrate may be smaller than a diameter of the lower dummy pad.

17 Claims, 16 Drawing Sheets

Related U.S. Application Data continuation of application No. 16/936,882, filed on Jul. 23, 2020, now Pat. No. 11,222,873.

(52) U.S. Cl.
CPC ............... *H01L 2224/0401* (2013.01); *H01L 2224/06181* (2013.01); *H01L 2224/06515* (2013.01); *H01L 2225/06513* (2013.01)

(58) Field of Classification Search
CPC . H01L 2225/06513; H01L 2224/16146; H01L 2224/73204; H01L 23/49816; H01L 24/06; H01L 2224/06515
USPC ........................................................ 257/700
See application file for complete search history.

(56) References Cited

U.S. PATENT DOCUMENTS

| | | | |
|---|---|---|---|
| 2011/0291246 A1 | 12/2011 | Jo et al. | |
| 2013/0153645 A1 | 6/2013 | Owens et al. | |
| 2013/0228898 A1* | 9/2013 | Ide | H01L 25/18 |
| | | | 257/621 |
| 2016/0064357 A1 | 3/2016 | Choe et al. | |
| 2016/0079208 A1 | 3/2016 | Heo et al. | |
| 2016/0155724 A1 | 6/2016 | Kim et al. | |
| 2016/0307944 A1 | 10/2016 | Chen et al. | |
| 2016/0358892 A1 | 12/2016 | Lee et al. | |
| 2017/0317062 A1* | 11/2017 | Shi | H01L 24/81 |
| 2017/0338206 A1* | 11/2017 | Seo | H01L 23/53238 |
| 2018/0211936 A1* | 7/2018 | Chang | H01L 24/96 |
| 2019/0221520 A1* | 7/2019 | Kim | H01L 24/06 |
| 2020/0161277 A1* | 5/2020 | Lee | H01L 21/76898 |
| 2020/0343218 A1* | 10/2020 | Hu | H01L 24/80 |
| 2021/0134760 A1* | 5/2021 | Gaide | H01L 24/80 |

FOREIGN PATENT DOCUMENTS

| | | |
|---|---|---|
| JP | 2015-111061 A | 6/2015 |
| JP | 6037876 B2 | 12/2016 |
| KR | 10-2012-0039184 A | 4/2012 |
| KR | 10-1354729 B1 | 1/2014 |
| KR | 10-1798657 B1 | 11/2017 |

* cited by examiner

METHODS OF INSPECTION OF SEMICONDUCTOR PACKAGES INCLUDING MEASUREMENT OF ALIGNMENT ACCURACY AMONG SEMICONDUCTOR CHIPS

CROSS-REFERENCE TO RELATED APPLICATIONS

This is a continuation of U.S. non-provisional patent application Ser. No. 17/571,796, filed Jan. 10, 2022, which is a continuation of U.S. non-provisional patent application Ser. No. 16/936,882, filed Jul. 23, 2020, which claims priority under 35 U.S.C. § 119 to Korean Patent Application No. 10-2019-0167005, filed on Dec. 13, 2019, in the Korean Intellectual Property Office, the entire contents of each of which are hereby incorporated by reference.

BACKGROUND

The present disclosure relates to semiconductor packages, and in particular, to capacitors of semiconductor packages.

With the rapid progress of electronic technology and the needs of users, electronic devices are becoming smaller and smaller. Researches and developments on semiconductor chips and packages with through-silicon vias (TSVs) are being continuously conducted to realize electronic devices with small size, high performance, and large capacity. In particular, various chip stacking technologies have been proposed to realize high-density semiconductor devices. For example, there are multi-chip package technologies of mounting a plurality of chips in a single semiconductor package or a system-in-package technology of providing several kinds of stacked multiple chips serving as a single system. Meanwhile, in the case of a highly-integrated semiconductor device, pads for interconnecting stacked chips should also be scaled down.

SUMMARY

Some example embodiments of the inventive concepts provides a semiconductor package, to which a test operation can be performed in a non-destructive manner.

According to some example embodiments of the inventive concepts, a semiconductor package may include a first substrate and a second substrate, which are vertically stacked, a semiconductor device layer on a bottom surface of the second substrate to face a top surface of the first substrate, upper chip pads and an upper dummy pad on the top surface of the first substrate, penetration electrodes, which each penetrate the first substrate and are connected to separate, respective upper chip pads of the upper chip pads, lower chip pads on a bottom surface of the semiconductor device layer which and are electrically connected to separate, respective upper chip pads of the upper chip pads, and a lower dummy pad on the bottom surface of the semiconductor device layer and which is electrically isolated from the upper dummy pad. A distance, in a horizontal direction that is parallel to the first substrate, between the upper dummy pad and the lower dummy pad may be smaller than a diameter of the lower dummy pad.

According to some example embodiments of the inventive concepts, a semiconductor package may include a first semiconductor chip and a second semiconductor chip, which are vertically stacked, upper chip pads on a top surface of the first semiconductor chip, lower chip pads on a bottom surface of the second semiconductor chip and which are electrically connected to separate, respective upper chip pads of the upper chip pads, a first upper dummy pad on the top surface of the first semiconductor chip, a first lower dummy pad on the bottom surface of the second semiconductor chip and which is adjacent to the first upper dummy pad, a second upper dummy pad on the top surface of the first semiconductor chip, and a second lower dummy pad on the bottom surface of the second semiconductor chip and which is adjacent to the second upper dummy pad. The first upper dummy pad may be isolated from direct contact with the first lower dummy pad in a first direction, and the second upper dummy pad may be isolated from direct contact with the second lower dummy pad in an opposite direction of the first direction.

According to some example embodiments of the inventive concepts, a semiconductor package may include a first semiconductor chip and a second semiconductor chip, which are vertically stacked, upper chip pads on a top surface of the first semiconductor chip, lower chip pads on a bottom surface of the second semiconductor chip and electrically connected to separate, respective upper chip pads of the upper chip pads, a first upper dummy pad on the top surface of the first semiconductor chip, a first lower dummy pad on the bottom surface of the second semiconductor chip and adjacent to the first upper dummy pad, a second upper dummy pad on the top surface of the first semiconductor chip, and a second lower dummy pad on the bottom surface of the second semiconductor chip and adjacent to the second upper dummy pad. A first horizontal distance between the first upper dummy pad and the first lower dummy pad may be smaller than a second horizontal distance between the second upper dummy pad and the second lower dummy pad.

According to some example embodiments, a semiconductor package may be provided that includes stacked chips precisely aligned to each other.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given example embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Figure 1:
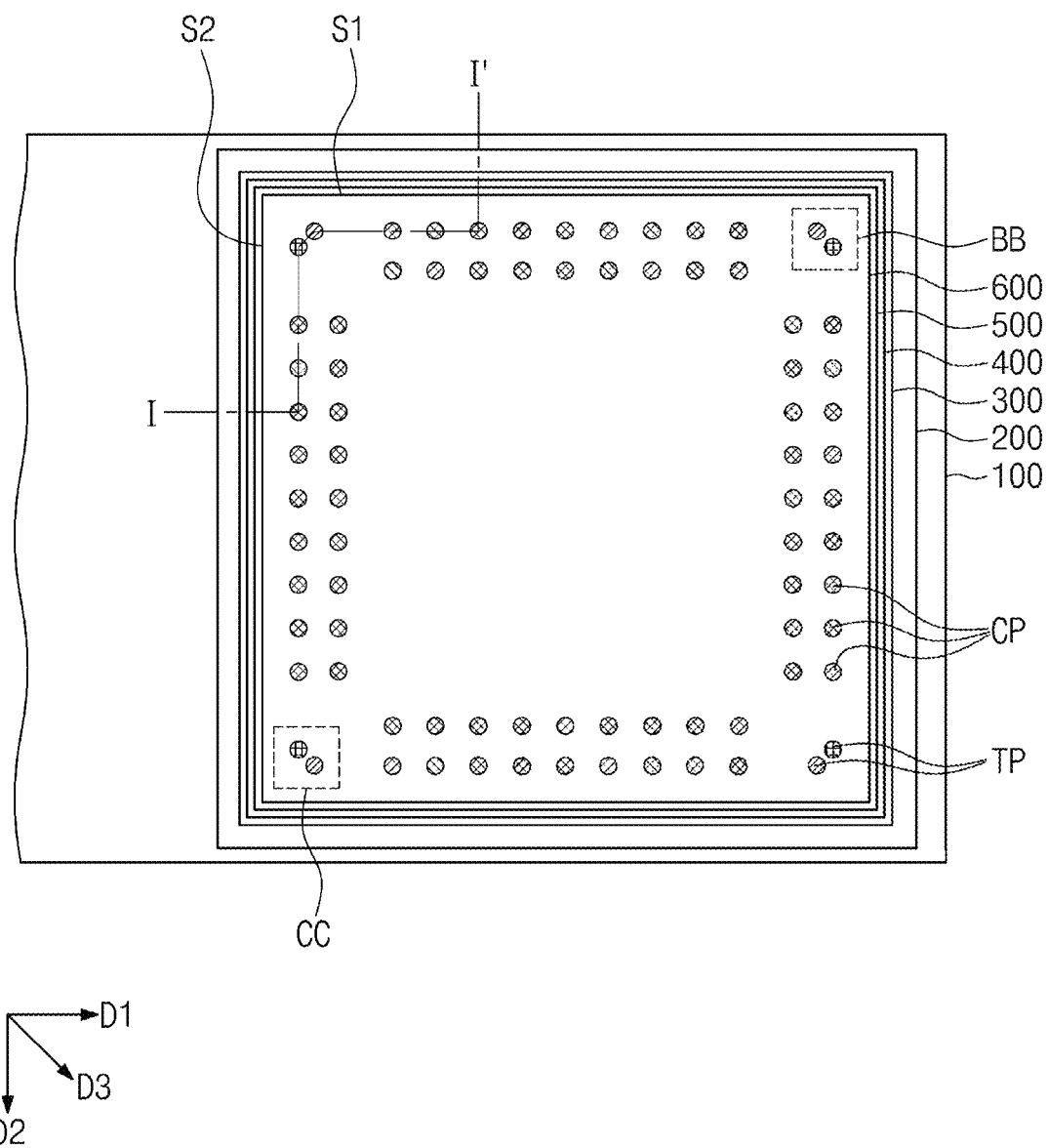
FIG. 1 is a plan view illustrating a semiconductor package according to some example embodiments of the inventive concepts.
Figure 2:
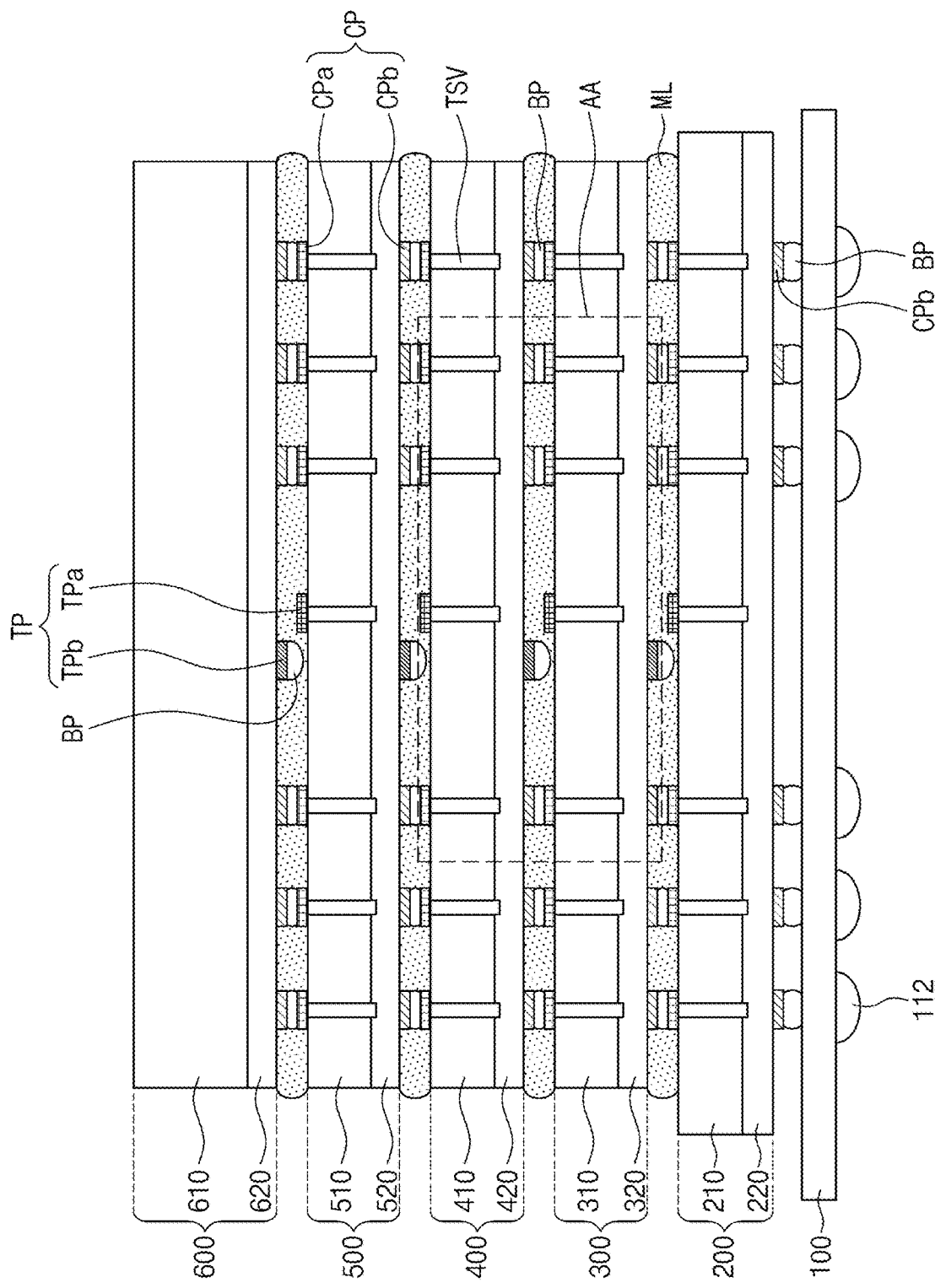
FIG. 2 is a sectional view taken along a line I-I' of FIG. 1.

FIG. 1 is a plan view illustrating a semiconductor package according to some example embodiments of the inventive concepts. FIG. 2 is a sectional view taken along a line I-I' of FIG. 1.

Referring to FIGS. 1 and 2, a semiconductor package may include a package substrate 100, first to fourth semiconductor chips 300, 400, 500, and 600 mounted (e.g., vertically stacked) on the package substrate 100, and a buffer chip 200 between the package substrate 100 and the first semiconductor chip 300.

The package substrate 100 may be, for example, a printed circuit board or a ceramic board. The package substrate 100 may include a base layer, which is formed of or includes an insulating material, and interconnection lines, which are provided in the base layer. The base layer may include insulating layers, which are vertically stacked, and the interconnection lines may be formed between the insulating layers. The package substrate 100 may serve as a substrate supporting the semiconductor package. The base layer of the package substrate 100 may be formed of or include at least one of, for example, phenolic resin, epoxy resin, or polyimide.

Terminal portions 112 may be disposed on a bottom surface of the package substrate 100. The terminal portions 112 may be connected to the interconnection lines in the package substrate 100 and may be attached to the bottom surface of the package substrate 100. The terminal portions 112 may be formed of or include at least one of conductive materials. The terminal portions 112 may be, for example, solder balls or bumps. The terminal portions 112 may electrically connect the semiconductor package to an external device.

It will be understood that any element described herein to be "on" another element may be "directly" on the other element (e.g., in direct contact with) or "indirectly" on the other element (e.g., isolated from direct contact with the other element by one or more interposing structures or spaces). Additionally, it will be understood that any element described herein to be "on" another element may be above or beneath the other element.

The first to fourth semiconductor chips 300, 400, 500, and 600 may be provided on the package substrate 100. In some example embodiments, the first to fourth semiconductor chips 300, 400, 500, and 600 may be high-bandwidth-memory dynamic random-access memory (HBM DRAM) chips. In some example embodiments, the semiconductor package may include more or less than four semiconductor chips. For example, the semiconductor package may include two semiconductor chips or eight or more semiconductor chips. The description that follows will refer to an example, in which the semiconductor package is configured to have four semiconductor chips, but the inventive concepts are not limited to a specific number of the semiconductor chips.

The first semiconductor chip 300 may include a first substrate 310 and a first semiconductor device layer 320, where the first substrate 310 is on (e.g., directly on and above) the first semiconductor device layer 320. The second semiconductor chip 400 may include a second substrate 410 and a second semiconductor device layer 420, where the second substrate 410 is on (e.g., directly on and above) the second semiconductor device layer 420. The third semiconductor chip 500 may include a third substrate 510 and a third semiconductor device layer 520. The fourth semiconductor chip 600 may include a fourth substrate 610 and a fourth semiconductor device layer 620. As shown, the first substrate 310, the second substrate 410, the third substrate 510, and the fourth substrate 610 are vertically stacked (e.g., stacked in the vertical direction that is perpendicular to a top surface of one or more substrates and/or a top surface of one or more semiconductor chips of the semiconductor package (e.g., perpendicular to a top surface of first substrate 310), such that the first semiconductor chip 300, the second semiconductor chip 400, the third semiconductor chip 500, and the fourth semiconductor chip 500 are vertically stacked.

As shown in FIG. 2, a top surface of a semiconductor chip may be the top surface of the substrate included in the semiconductor chip, and a bottom surface of the semiconductor chip may be the bottom surface of the semiconductor device layer included in the semiconductor chip. For example, a top surface of the first semiconductor chip 300 may be a top surface of the first substrate 310 and a bottom surface of the first semiconductor chip 300 may be a bottom surface of the first semiconductor device layer 320. Accordingly, a top surface of a given substrate of a given semiconductor chip (e.g., a top surface of the first substrate 310 of the first semiconductor chip 300) may be interchangeably referred to herein as the top surface of the given semiconductor chip (e.g., the top surface of the first semiconductor chip 300), and a bottom surface of a given semiconductor device layer of a given semiconductor chip (e.g., a bottom surface of the first semiconductor device layer 320 of the first semiconductor chip 300) may be interchangeably referred to herein as the bottom surface of the given semiconductor chip (e.g., the bottom surface of the first semiconductor chip 300)

In some example embodiments, each of the first to fourth substrates 310, 410, 510, and 610 may be a bulk silicon substrate or a silicon-on-insulator (SOI) substrate. In some example embodiments, each of the first to fourth substrates 310, 410, 510, and 610 may be formed of or include at least one of silicon germanium, silicon germanium on insulator (SGOI), indium antimonide, lead telluride compound, indium arsenic, indium phosphide, gallium arsenic, or gallium antimonide.

The first to fourth semiconductor device layers 320, 420, 520, and 620 may be formed on bottom surfaces of the first to fourth substrates 310, 410, 510, and 610, respectively. Accordingly, and as shown in at least FIG. 2, for example, the second semiconductor device layer 420 may be on (e.g., directly on) a bottom surface of the second substrate 410 to face a top surface of the first substrate 310 (e.g., to be offset from the top surface of the first substrate 310 in a vertical direction that is perpendicular to a top surface of one or more substrates and/or a top surface of one or more semiconductor chips of the semiconductor package (e.g., perpendicular to a top surface of first substrate 310) such that the bottom surface of the second semiconductor device layer 420 and the top surface of the first substrate 310 are opposing surfaces across a space that is at least partially filled by an insulating layer ML). Each of the first to fourth semiconductor device layers 320, 420, 520, and 620 may include individual devices of several kinds and an interlayered insulating layer covering the individual devices. The individual devices may be, for example, memory devices. In some example embodiments, the memory devices may include volatile memory devices (e.g., dynamic random access memory (DRAM) and static random access memory (SRAM) devices) or nonvolatile memory devices (e.g., phase-change random access memory (PRAM), magnetoresistive random access memory (MRAM), ferroelectric random access memory (FeRAM), and resistive random access memory (RRAM) devices).

In some example embodiments, each of the individual devices may be integrated on a surface of a corresponding one of the first to fourth substrates 310, 410, 510, and 610. Thus, the first to fourth substrates 310, 410, 510, and 610 and the first to fourth semiconductor device layers 320, 420, 520, and 620 may not be differentiated from each other with clear borders. As an example, a portion of a semiconductor substrate may be used as each of the first to fourth substrates 310, 410, 510, and 610, and another portion of the semiconductor substrate, on which the individual devices are integrated, may be used as each of the first to fourth semiconductor device layers 320, 420, 520, and 620.

The first to third semiconductor chips 300, 400, and 500 may include penetration electrodes TSV. The penetration electrodes TSV may be provided to penetrate the first to third substrates 310, 410, and 510 and may be electrically coupled to the individual devices in the first to third semiconductor device layers 320, 420, and 520. For example, as shown in at least FIG. 2, the first semiconductor chip 300 may include a first penetration electrode TSV penetrating the first substrate 310 and extending into (e.g., into an interior of) the first semiconductor device layer 320, and the second semiconductor chip 400 may include a second penetration electrode TSV penetrating the second substrate 410 and extending into (e.g., into an interior of) the second semiconductor device layer 420. In some example embodiments, the penetration electrodes TSV may be provided to partially, but not completely, penetrate the first to third semiconductor chips 300, 400, and 500. For example, bottom ends of the penetration electrodes TSV may be placed in the first to third semiconductor device layers 320, 420, and 520. As shown in at least FIG. 2, in some example embodiments at least some penetration electrodes TSV may each penetrate the first substrate 310 and may be connected to separate, respective upper chip pads CPa of the upper chip pads CPa. However, the inventive concepts are not limited to this structure of the penetration electrodes TSV. Although not shown, in some example embodiments, the penetration electrodes TSV may be provided to completely penetrate the first to third substrates 310, 410, and 510 and the first to third semiconductor device layers 320, 420, and 520. The structure and shape of the penetration electrode TSV may vary depending on when it is formed and how it is formed. For example, the penetration electrodes TSV may be formed before a front-end-of-line (FEOL) process, during or after a back-end-of-line (BEOL) process, or between the FEOL and BEOL processes.

The fourth semiconductor chip 600 may not include the penetration electrodes TSV, unlike the first to third semiconductor chips 300, 400, and 500. For example, the fourth substrate 610 may have a TSV-free structure. The fourth semiconductor chip 600 may be the topmost chip of the first to fourth semiconductor chips 300, 400, 500, and 600. The fourth substrate 610 of the fourth semiconductor chip 600 may be thicker than the first to third substrates 310, 410, and 510.

Chip pads CP may be provided between two adjacent chips of the first to fourth semiconductor chips 300, 400, 500, and 600. The chip pads CP may be used to electrically connect the first to fourth semiconductor chips 300, 400, 500, and 600 to each other. The chip pads CP may be formed of or include at least one of, for example, aluminum (Al), copper (Cu), nickel (Ni), tungsten (W), platinum (Pt), or gold (Au). The chip pads CP may be disposed on top and bottom surfaces of the first to fourth semiconductor chips 300, 400, 500, and 600 and may be electrically connected to interconnection lines in each of the first to fourth semiconductor chips 300, 400, 500, and 600.

In detail, the chip pads CP may include upper chip pads CPa and lower chip pads CPb. Each of the upper and lower chip pads CPa and CPb may have a circular shape, when viewed in a plan view. The upper chip pads CPa may be disposed on a top surface of each of the first to third semiconductor chips 300, 400, and 500. For example, the upper chip pads CPa may be disposed on top surfaces of the first to third substrates 310, 410, and 510. Each of the upper chip pads CPa may be disposed on and electrically connected to a corresponding one of the penetration electrodes TSV. It will be understood that, as described herein, a "plan view" may refer to a view that is perpendicular to a top surface of one or more substrates and/or a top surface of one or more semiconductor chips of the semiconductor package (e.g., perpendicular to a top surface of first substrate 310), where said top surface(s) will be understood to define a horizontal plane. Accordingly, an element and/or property that is described herein with reference to being viewed "in a plan view" may be an element and/or property that is present and/or apparent in a plane that is parallel to a top surface of one or more substrates and/or one or more semiconductor chips of the semiconductor package (e.g., a horizontal plane). Further, "a plan view" as described herein may refer to a view of one or more portions of a semiconductor package where the view is in a vertical direction that is perpendicular to one or more horizontal planes extending parallel to a top surface of one or more substrates and/or a top surface of one or more semiconductor chips of the semiconductor package (e.g., parallel to a top surface of first substrate 310).

The lower chip pads CPb may be disposed on a bottom surface of each of the first to fourth semiconductor chips

300, 400, 500, and 600. For example, the lower chip pads CPb may be disposed on bottom surfaces of the first to fourth semiconductor device layers 320, 420, 520, and 620. The chip pads CP may electrically connect two adjacent ones of the semiconductor chips to each other. For example, as shown in FIG. 2, lower chip pads CPb on a bottom surface of the second semiconductor chip 400 (e.g., on a bottom surface of the second semiconductor device layer 420) may be electrically connected to separate, respective upper chip pads CPa of the upper chip pads CPa on a top surface of the first semiconductor chip 300 (e.g., on a top surface of the first substrate 310). For example, the upper chip pads CPa of the first semiconductor chip 300 may be electrically connected to separate, respective lower chip pads of the lower chip pads CPb of the second semiconductor chip 400. In some example embodiments, the upper chip pads CPa of the second semiconductor chip 400 may be electrically connected to the lower chip pads CPb of the third semiconductor chip 500. Similarly, the upper chip pads CPa of the third semiconductor chip 500 may be electrically connected to the lower chip pads CPb of the fourth semiconductor chip 600. In some example embodiments, the upper chip pads CPa may not be disposed on a top surface of the fourth semiconductor chip 600.

Bumps BP may be disposed between the upper and lower chip pads CPa and CPb. Each of the bumps BP may have a flattened sphere or circular disk shape. In some example embodiments, the bumps BP may be solder balls. The bumps BP may electrically connect the upper chip pads CPa to the lower chip pads CPb. The bumps BP may be formed of or include at least one of tin (Sn), indium (In), bismuth (Bi), antimony (Sb), copper (Cu), silver (Ag), zinc (Zn), lead (Pb), and/or alloys thereof. For example, the bumps BP may be formed of or include Sn, Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, or Sn—Bi—Zn.

Dummy pads TP may be provided between two adjacent chips of the first to fourth semiconductor chips 300, 400, 500, and 600. The dummy pads TP may be formed of or include the same material as the chip pads CP. The dummy pads TP may be disposed on the top and bottom surfaces of the first to fourth semiconductor chips 300, 400, 500, and 600 and may be electrically connected to the interconnection lines, which are provided in each of the first to fourth semiconductor chips 300, 400, 500, and 600. In some example embodiments, the dummy pads TP may be used as test pads for measuring alignment accuracy of the first to fourth semiconductor chips 300, 400, 500, and 600.

In detail, the dummy pads TP may include upper dummy pads TPa and lower dummy pads TPb. The upper dummy pads TPa and the lower dummy pads TPb may have a circular shape, when viewed in a plan view. The upper dummy pads TPa may be disposed on the top surface of each of the first to third semiconductor chips 300, 400, and 500. In other words, the upper dummy pads TPa may be disposed on the top surfaces of the first to third substrates 310, 410, and 510. Each of the upper dummy pads TPa may be disposed on and electrically connected to a corresponding one of the penetration electrode TSV.

The lower dummy pads TPb may be disposed on the bottom surface of each of the first to fourth semiconductor chips 300, 400, 500, and 600. For example, the lower dummy pads TPb may be disposed on bottom surfaces of the first to fourth semiconductor device layers 320, 420, 520, and 620. The lower dummy pads TPb may be disposed adjacent to the upper dummy pads TPa but may not be overlapped with the upper dummy pads TPa, when viewed in a plan view. For example, a lower dummy pad TPb on a bottom surface of the second semiconductor chip 400 (e.g., on a bottom surface of the second semiconductor device layer 420) may be adjacent, in a horizontal direction that is parallel to a top surface of one or more substrates and/or a top surface of one or more semiconductor chips of the semiconductor package (e.g., parallel to a top surface of first substrate 310), to an upper dummy pad TPa that is on a top surface of the first semiconductor chip 300 (e.g., on a top surface of the first substrate 310). The lower dummy pad TPb may be electrically disconnected from ("isolated from") the upper dummy pad TPa closest thereto.

The bumps BP may be disposed on bottom surfaces of the lower dummy pads TPb. The bumps BP on the bottom surfaces of the lower dummy pads TPb may not be connected to (e.g., may be isolated from direct contact with) the upper dummy pads TPa. As shown in FIG. 2, the bumps BP on the bottom surfaces of the lower dummy pads TPb may have rounded bottom portions (e.g., may have hemispherical-shaped bottom portions), unlike the bumps BP placed between the chip pads CP.

Insulating layers ML may be provided between the first to fourth semiconductor chips 300, 400, 500, and 600. The insulating layer ML may fill a space between each adjacent pair of the first to fourth semiconductor chips 300, 400, 500, and 600. An insulating layer ML may fill an entirety of a space between each adjacent pair of the first to fourth semiconductor chips 300, 400, 500, and 600. For example, as shown in FIG. 2, an insulating layer ML may be between the first substrate 310 and the second semiconductor device layer 420 and may fill (e.g., may fill some or an entirety of) a space therebetween (e.g., a space between the first semiconductor chip 300 and the second semiconductor chip 400), such that the insulating layer ML covers (e.g., directly contacts) both the first substrate 310 and the second semiconductor device layer 420 and isolates the first substrate 310 and the second semiconductor device layer 420 from each other. The insulating layer ML may be formed of or include at least one of under-fill materials (e.g., insulating polymer, epoxy resin, non-conductive film (NCF), or the like). The insulating layer ML may be used as an adhesion layer in a chip stacking process, which includes a step of bonding semiconductor chips using a thermo-compression bonding (TCB) method. However, in some example embodiments, the insulating layer ML may be formed by a molded under-fill (MUF) method, and in this case, the insulating layer ML may be a part of a molding layer (not shown) encapsulating the semiconductor package.

The insulating layer ML may cover the chip pads CP, the dummy pads TP, and the bumps BP. In detail, the insulating layer ML may cover side surfaces of the upper chip pads CPa, side surfaces of the lower chip pads CPb, and side surfaces of the bump BP, which is disposed between the upper and lower chip pads CPa and CPb. The insulating layer ML may also cover (e.g., directly contact some or all of, and thus partially or totally isolate from exposure) side and/or top surfaces of the upper dummy pads TPa. The insulating layer ML may cover side surfaces of the lower dummy pads TPb and bottom surfaces of the bumps BP, which are disposed on the bottom surfaces of the lower dummy pads TPb.

The buffer chip 200 may be disposed between the package substrate 100 and the first semiconductor chip 300. The buffer chip 200 may be a logic chip. The buffer chip 200 may include a buffer substrate 210, a buffer semiconductor device layer 220 on a bottom surface of the buffer substrate 210, and the penetration electrodes TSV. In some example embodiments, the buffer semiconductor device layer 220 may include a controller controlling input/output operations of the first to fourth semiconductor chips 300, 400, 500, and 600.

The penetration electrodes TSV of the buffer chip 200 may be provided to penetrate the buffer substrate 210 and may be coupled to the buffer semiconductor device layer 220. The upper chip pad CPa may be disposed on a top surface of the buffer chip 200 (i.e., the top surface of the buffer substrate 210). The upper chip pad CPa may be electrically connected to the lower chip pad CPb, which is provided on the bottom surface of the first semiconductor chip 300, through the bump BP. The upper dummy pad TPa may be disposed on the top surface of the buffer chip 200 (i.e., the top surface of the buffer substrate 210). The upper dummy pad TPa may be placed adjacent to the lower dummy pad TPb, which is provided on the bottom surface of the first semiconductor chip 300, but may be electrically disconnected from the lower dummy pad TPb.

The lower chip pads CPb and the bumps BP may be formed on the bottom surface of the buffer chip 200. The buffer chip 200 may be electrically connected to the package substrate 100 through the lower chip pads CPb and the bump BP.

In some example embodiments, the buffer chip 200 may be a dummy semiconductor chip, in which any individual device is not provided. The buffer chip 200 may be an interposer, which is configured to receive at least one of control, power, or ground signals to operate the semiconductor chips 300, 400, 500, and 600 or data to be stored in the semiconductor chips 300, 400, 500, and 600, from the outside through the penetration electrodes TSV or to output data stored in the semiconductor chips 300, 400, 500, and 600 to the outside through the penetration electrodes TSV.

In some example embodiments, the first semiconductor chip 300 may be directly connected to the package substrate 100. In this case, the buffer chip 200 disposed between the package substrate 100 and the first semiconductor chip 300 may be omitted.

Figure 3:
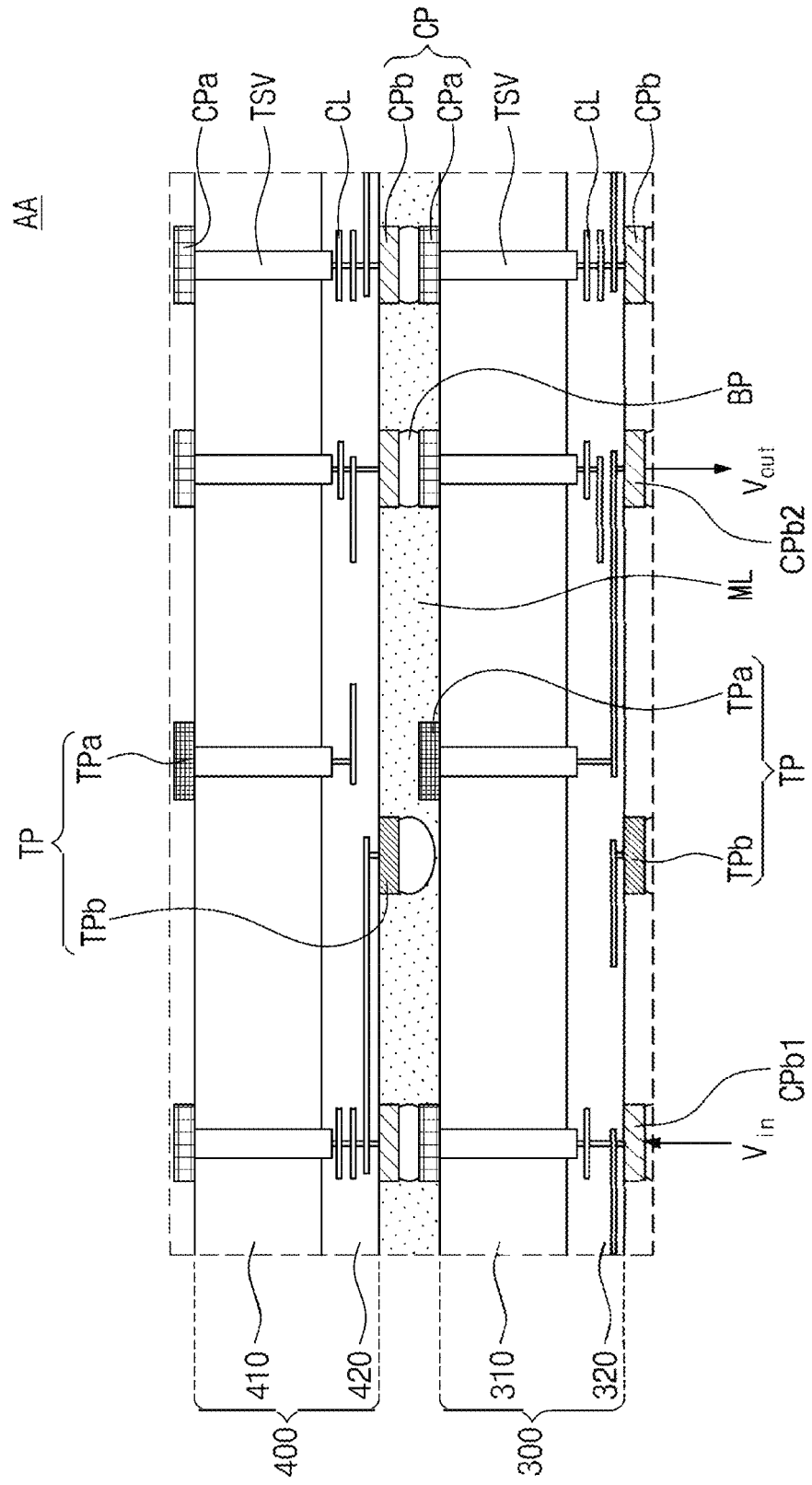
FIG. 3 is an enlarged sectional view illustrating a portion 'AA' of FIG. 2.
Figure 4:
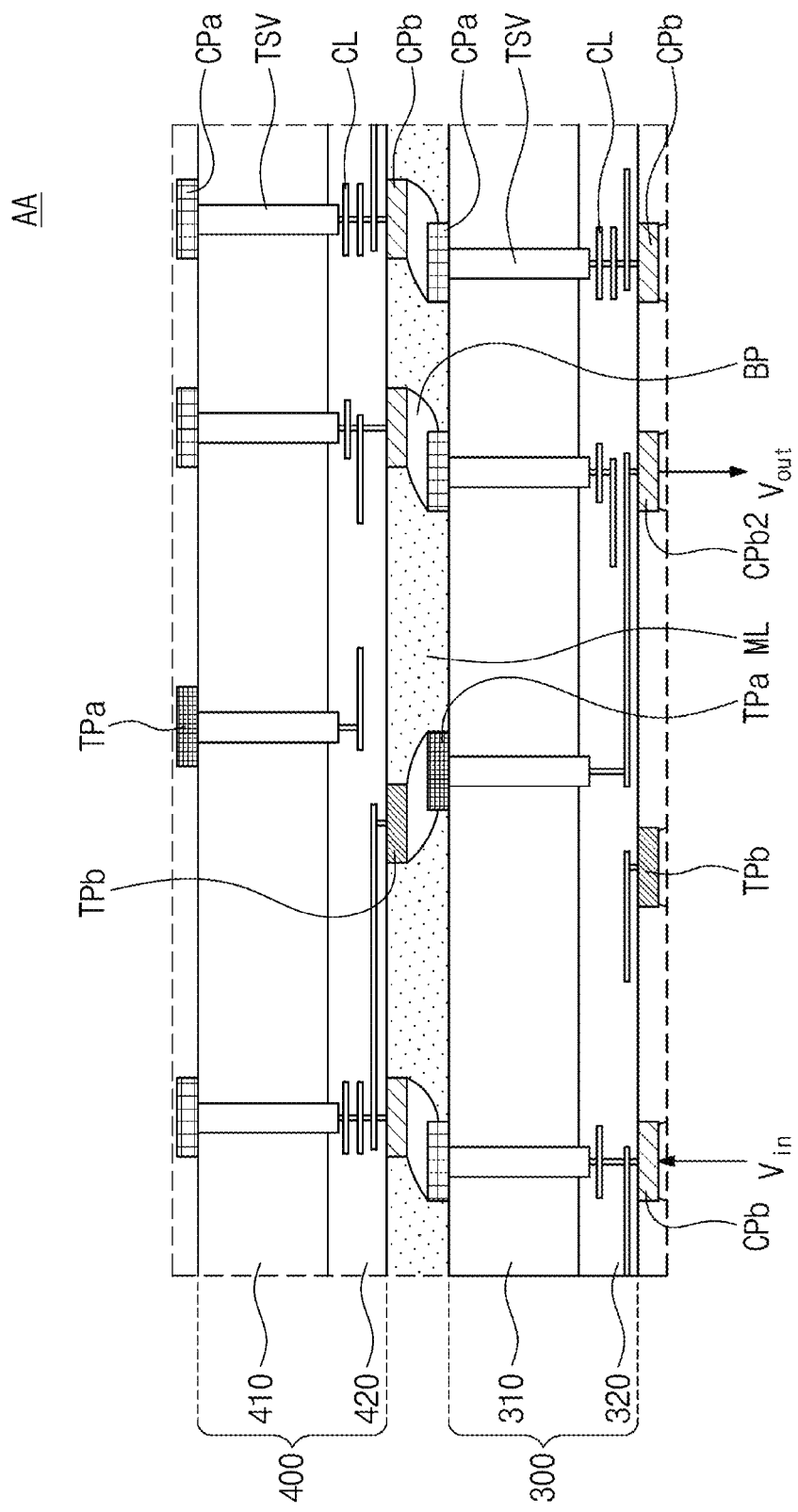
FIG. 4 is a diagram illustrating a non-destructive test operation, which is performed on a portion (e.g., 'AA' of FIG. 2) of a semiconductor package according to some example embodiments of the inventive concepts.

FIG. 3 is an enlarged sectional view illustrating a portion 'AA' of FIG. 2. FIG. 4 is a diagram illustrating a non-destructive test operation, which is performed on a portion (e.g., 'AA' of FIG. 2) of a semiconductor package according to some example embodiments of the inventive concepts.

Hereinafter, the first and second semiconductor chips 300 and 400 will be described in more detail. In addition, the chip and dummy pads CP and TP positioned between the first and second semiconductor chips 300 and 400 will also be described in more detail. The structures of the third and fourth semiconductor chips 500 and 600 and the chip and dummy pads CP and TP provided on the top and bottom surfaces thereof may be similar to those of the first and second semiconductor chips 300 and 400 and the chip and dummy pads CP and TP to be described below.

Referring to FIG. 3, each of the first and second semiconductor chips 300 and 400 may include conductive lines CL. The conductive line CL may be formed in each of the first and second semiconductor device layers 320 and 420. Restated, a conductive line CL may be located within an interior of one of the first and second semiconductor device layers 320 and 420. The conductive line CL in the first semiconductor device layer 320 may be electrically connected to the penetration electrodes TSV penetrating the first substrate 310. The conductive line CL in the second semiconductor device layer 420 may be electrically connected to the penetration electrode TSV penetrating the second substrate 410.

The lower chip pads CPb may be connected to the penetration electrodes TSV through the conductive lines CL. The upper chip pads CPa may be disposed on the penetration electrodes TSV and may be directly connected to the penetration electrodes TSV.

The lower dummy pads TPb may be connected to the penetration electrodes TSV through the conductive lines CL. Here, at least one of the lower dummy pads TPb and the lower chip pad CPb may be connected in common to one of the penetration electrodes TSV through the conductive line CL. Accordingly, a conductive line CL may electrically connect a lower dummy pad TPb (e.g., a lower dummy pad TPb on the bottom surface of the second semiconductor device layer 420) to at least one upper chip pad CPa of the upper chip pads CPA (e.g., at least one upper chip pad CPa on the top surface of the first substrate 310). The upper dummy pads TPa may be directly connected to the penetration electrodes TSV, without (e.g., independently of) the conductive line CL. Accordingly, each upper dummy pad TPa may be electrically connected to at least one penetration electrode TSV.

Referring to FIGS. 2 to 4, the alignment accuracy of the first and second semiconductor chips 300 and 400 may be measured. In the case where, as shown in FIG. 3, the upper and lower chip pads CPa and CPb facing each other are vertically aligned to each other, the upper and lower dummy pads TPa and TPb may not be overlapped with each other, when viewed in a plan view. In other words, the upper dummy pad TPa may be electrically disconnected from the lower dummy pad TPb closest thereto. By contrast, in the case where, as shown in FIG. 4, the upper and lower dummy pads TPa and TPb are vertically overlapped with each other at least partially, the upper and lower chip pads CPa and CPb facing each other may be in a vertically-misaligned state.

The measuring of the alignment accuracy between the first and second semiconductor chips 300 and 400 may include examining whether the lower dummy pad TPb on the bottom surface of the second semiconductor chip 400 is electrically connected to the upper dummy pad TPa on the top surface of the first semiconductor chip 300. If the examination shows that the lower dummy pad TPb on the bottom surface of the second semiconductor chip 400 is electrically connected to the upper dummy pad TPa on the top surface of the first semiconductor chip 300, the alignment accuracy between the first and second semiconductor chips 300 and 400 may be evaluated to be low.

In detail, the lower dummy pad TPb on the bottom surface of the second semiconductor chip 400 may be connected to a first lower chip pad CPb1, which is provided on the bottom surface of the first semiconductor chip 300, through the chip pads CP, the bump BP, the conductive line CL, and the penetration electrode TSV. The upper dummy pad TPa on the top surface of the first semiconductor chip 300 may be connected to a second lower chip pad CPb2, which is provided on the bottom surface of the first semiconductor chip 300, through the penetration electrode TSV and the conductive line CL.

As an example, the electric connection state between the lower dummy pad TPb on the bottom surface of the second semiconductor chip 400 and the upper dummy pad TPa on the top surface of the first semiconductor chip 300 may be determined by measuring electric resistance between a first lower chip pad CPb1 and a second lower chip pad CPb2. In some example embodiments, the electric resistance between the first lower chip pad CPb1 and the second lower chip pad CPb2 may be measured using, for example, an insulation resistance meter.

As another example, the electric connection state between the lower dummy pad TPb on the bottom surface of the second semiconductor chip 400 and the upper dummy pad TPa on the top surface of the first semiconductor chip 300 may be determined by applying a test voltage $V_{in}$ to the first lower chip pad CPb1 and measuring an output voltage $V_{out}$ output through the second lower chip pad CPb2.

Figure 5A:
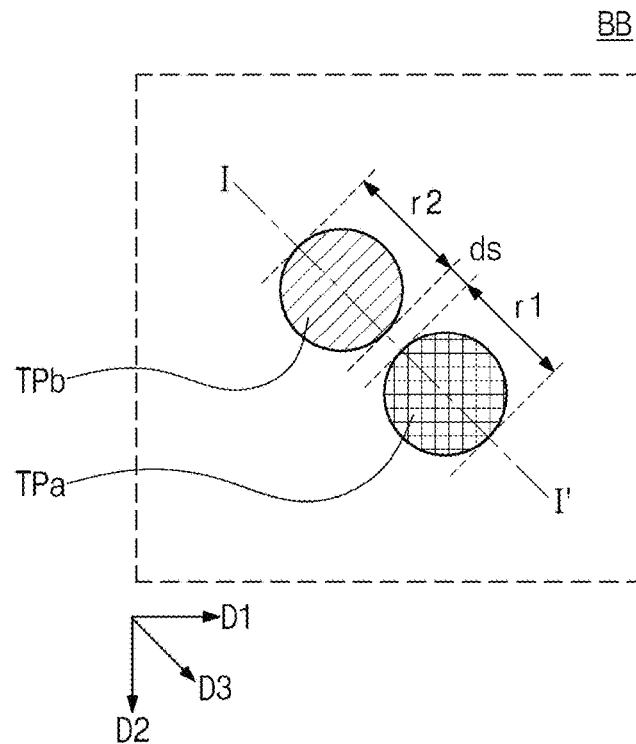
FIGS. 5A and 6A are enlarged plan views illustrating a portion BB of FIG. 1.
Figure 5B:
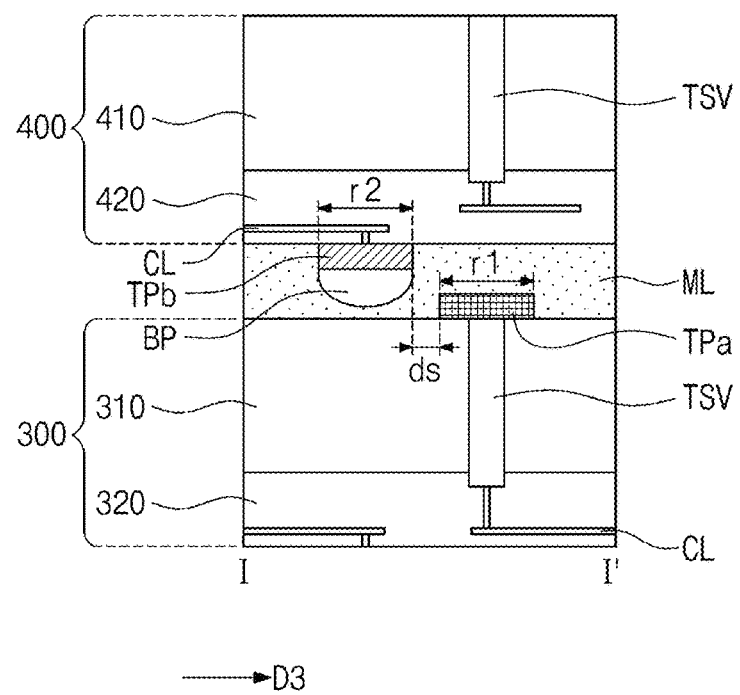
FIGS. 5B and 6B are sectional views taken along lines I-I' of FIGS. 5A and 5A, respectively.
Figure 6A:
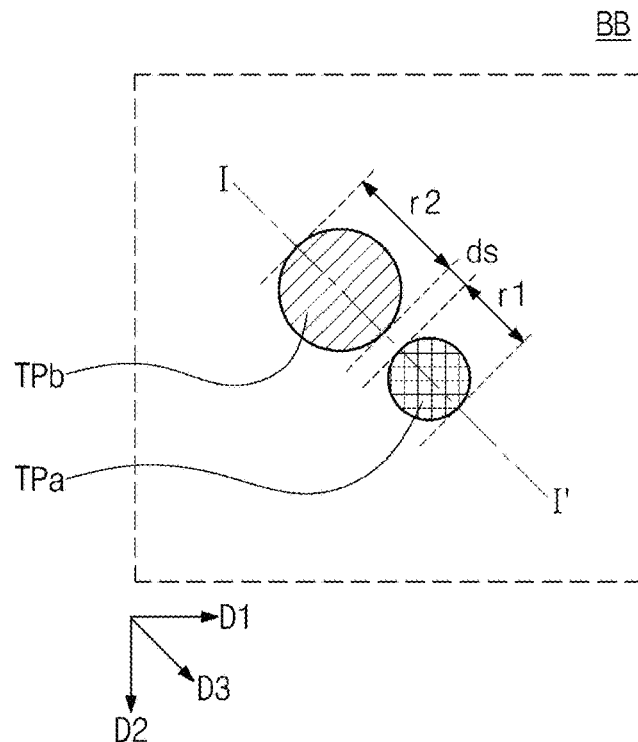
Figure 6B:
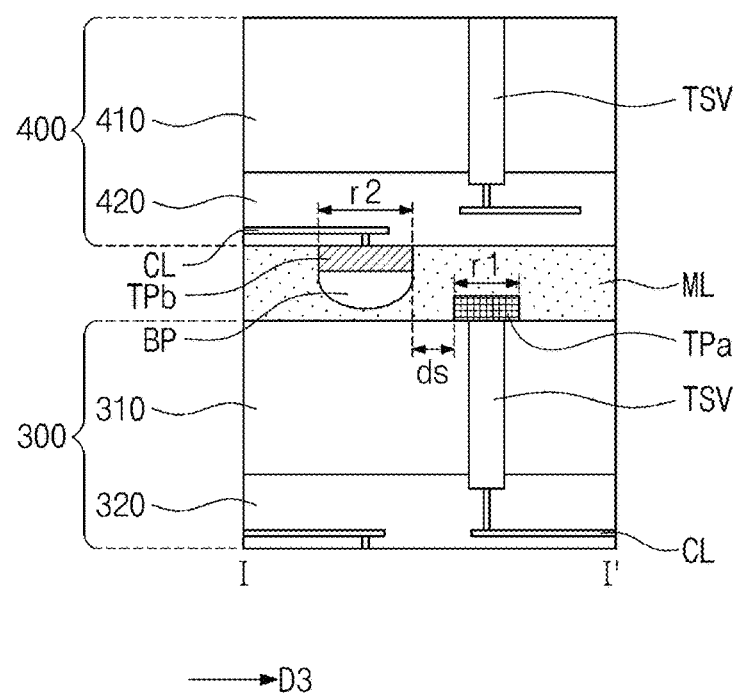

FIGS. 5A and 6A are enlarged plan views illustrating a portion BB of FIG. 1. FIGS. 5B and 6B are sectional views taken along lines I-I' of FIGS. 5A and 6A, respectively.

Referring to FIGS. 5A and 5B, when viewed in a plan view (e.g., in a horizontal direction), a diameter r1 of the upper dummy pad TPa may be equal or substantially equal to a diameter r2 of the lower dummy pad TPb. For example, the diameter r1 of the upper dummy pad TPa and the diameter r2 of and the lower dummy pad TPb may range from about 10 μm to about 30 μm. When viewed in a plan view, a distance ds between the upper and lower dummy pads TPa and TPb (e.g., a distance ds in a horizontal direction that is parallel to a top surface of one or more substrates and/or a top surface of one or more semiconductor chips of the semiconductor package (e.g., parallel to a top surface of first substrate 310), such distance ds also referred to herein interchangeably as a "horizontal direction") may be smaller than the diameter r1 of the upper dummy pad TPa and/or the diameter r2 of the lower dummy pad TPb. For example, when viewed in a plan view, the distance ds between the upper and lower dummy pads TPa and TPb may range from about 3 μm to about 20 μm. When viewed in a plan view, the distance ds between the upper and lower dummy pads TPa and TPb may be larger than about 0.3 times the diameter r1 or r2 and may be smaller than about 1.0 times the diameter r1 or r2. It will be understood that any distance and/or direction that is shown to be in a plane that is perpendicular to the illustrated view that is viewed "in a plan view," for example distance ds shown in FIG. 5A, may be understood to be a distance in a horizontal direction (e.g., a direction extending parallel to a top surface of one or more substrates and/or a top surface of one or more semiconductor chips of the semiconductor package (e.g., parallel to a top surface of first substrate 310)).

If the distance ds is smaller than about 3 μm or about 0.3 times the diameter r1 or r2, due to the sweep of the bump BP, the upper and lower dummy pads TPa and TPb may be electrically connected to each other, regardless of the alignment accuracy. If the distance ds is larger than about 20 μm or the diameter r1 or r2, the upper and lower dummy pads TPa and TPb may not be electrically connected to each other, even when the semiconductor chips are in a misaligned state.

The bump BP may be disposed on the bottom surface of the lower dummy pad TPb to fully cover the bottom surface of the lower dummy pad TPb. The bottom of the bump BP may not be connected to the upper dummy pad TPa and may be covered with the insulating layer ML. The bump BP may be spaced apart from (e.g., isolated from direct contact with) the top surface of the first semiconductor chip 300, which may be the top surface of the first substrate 310, such that the bump BP may be spaced apart from (e.g., isolated from direct contact with) the top surface of the first substrate 310.

Referring back to FIGS. 1, 5A, and 5B, the upper and lower dummy pads TPa and TPb may be spaced apart from (e.g., isolated from direct contact with) each other in a direction that is oblique to side surfaces S1 and S2 of the semiconductor package. In detail, as shown in FIG. 1, each of the first to fourth semiconductor chips 300, 400, 500, and 600 of the semiconductor package, and thus each of the first to fourth substrates 310, 410, 510, and 610, may include a first side surface S1 extending in a first direction D1 and a second side surface S2 extending in a second direction D2, which is not parallel to the first direction D1 (e.g., crosses the first direction). Each of the first and second directions D1 and D2 may be horizontal directions extending parallel to a top surface of one or more substrates and/or a top surface of one or more semiconductor chips of the semiconductor package (e.g., parallel to a top surface of first substrate 310). Each of the first to fourth semiconductor chips 300, 400, 500, and 600 may have a rectangular shape, when viewed in a plan view. Two adjacent ones of the dummy pads TP (e.g., an upper dummy pad TPa on the top surface of the first substrate 310 and a lower dummy pad TPb on the bottom surface of the second semiconductor device layer 420) may be spaced apart from (e.g., isolated from direct contact with) each other in a third direction D3 that is oblique to both the first and second directions D1 and D2 (e.g., the third direction D3 may be a horizontal direction that may cross both directions of the first direction D1 and the second direction D2). The third direction D3 may be parallel to a top surface of one or more substrates and/or a top surface of one or more semiconductor chips of the semiconductor package (e.g., parallel to a top surface of first substrate 310).

The upper and lower dummy pads TPa and TPb may be partially overlapped with each other in the first direction D1. For example, if the lower dummy pad TPb is moved in the first direction D1, the lower dummy pad TPb may be overlapped with at least a portion of the upper dummy pad TPa. In addition, the upper and lower dummy pads TPa and TPb may be partially overlapped with each other in the second direction D2. For example, if the lower dummy pad TPb is moved in the second direction D2, the lower dummy pad TPb may be overlapped with at least a portion of the upper dummy pad TPa. Since the upper and lower dummy pads TPa and TPb are at least partially overlapped with each other in the first and second directions D1 and D2, the misalignment between the semiconductor chips may be examined in various directions.

Referring to FIGS. 6A and 6B, the diameter r1 of the upper dummy pad TPa may be smaller than the diameter r2 of the lower dummy pad TPb. For example, the diameter r1 may be larger than about 0.3 times the diameter r2 and may be smaller than about 0.8 times the diameter r2.

Figure 7:
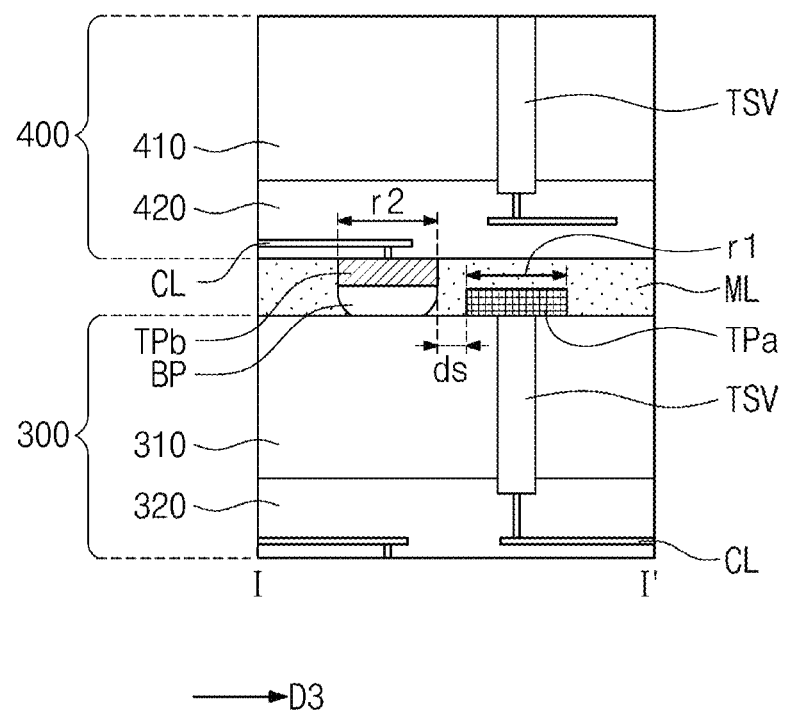
FIG. 7 is an enlarged sectional view, which is taken along a line I-I' of FIG. 5A to illustrate a semiconductor package according to some example embodiments of the inventive concepts.

FIG. 7 is an enlarged sectional view, which is taken along a line I-I' of FIG. 5A to illustrate a semiconductor package according to some example embodiments of the inventive concepts.

Referring to FIG. 7, the bump BP may be in contact with the top surface of the first semiconductor chip 300, which may be the top surface of the first substrate 310, such that the bump BP be in contact with the top surface of the first substrate 310. The side surface of the bump BP may be covered with the insulating layer ML, and the bottom surface of the bump BP may be covered with the top surface of the first substrate 310, not with the insulating layer ML.

Figure 8A:
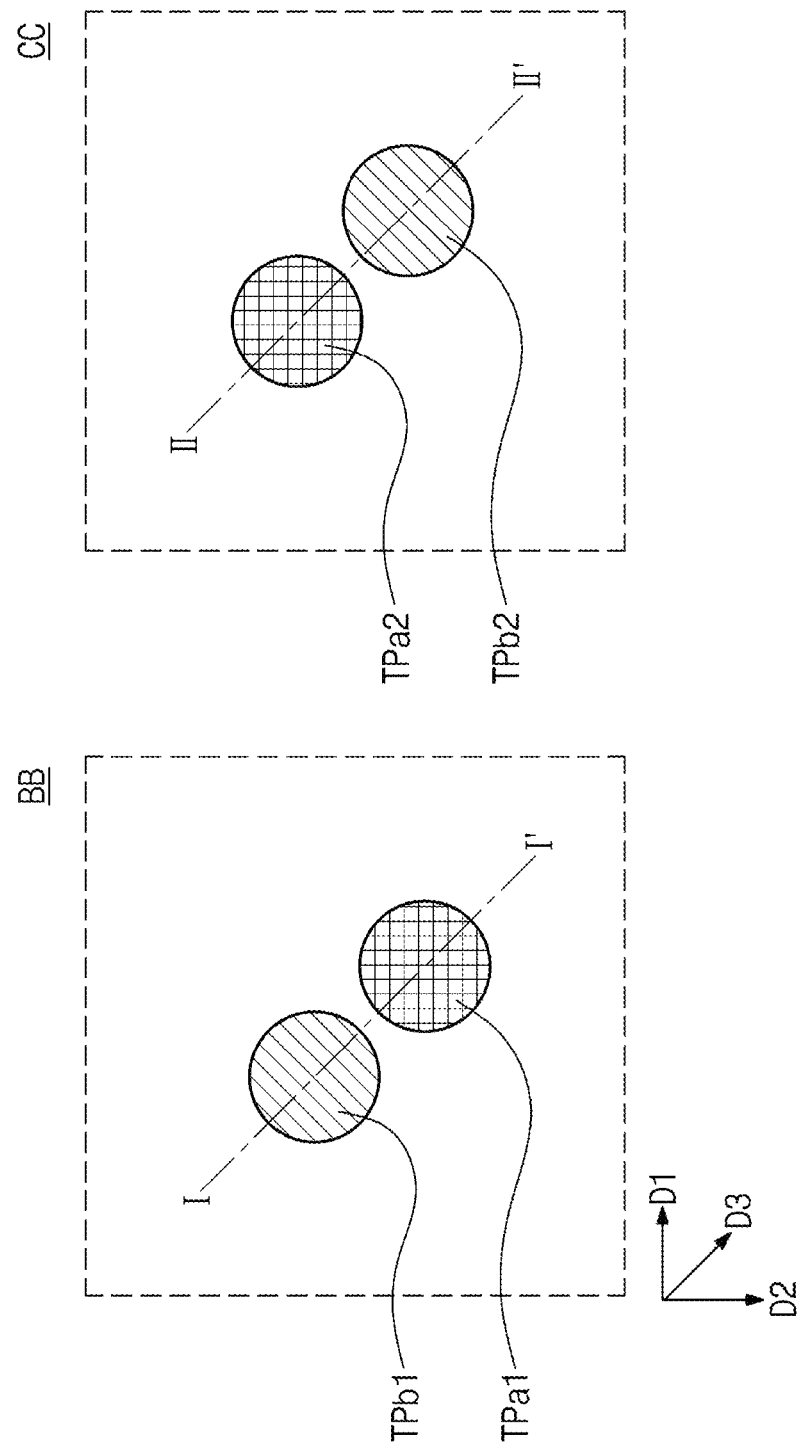
FIG. 8A is an enlarged plan view illustrating portions BB and CC of FIG. 1.
Figure 8B:
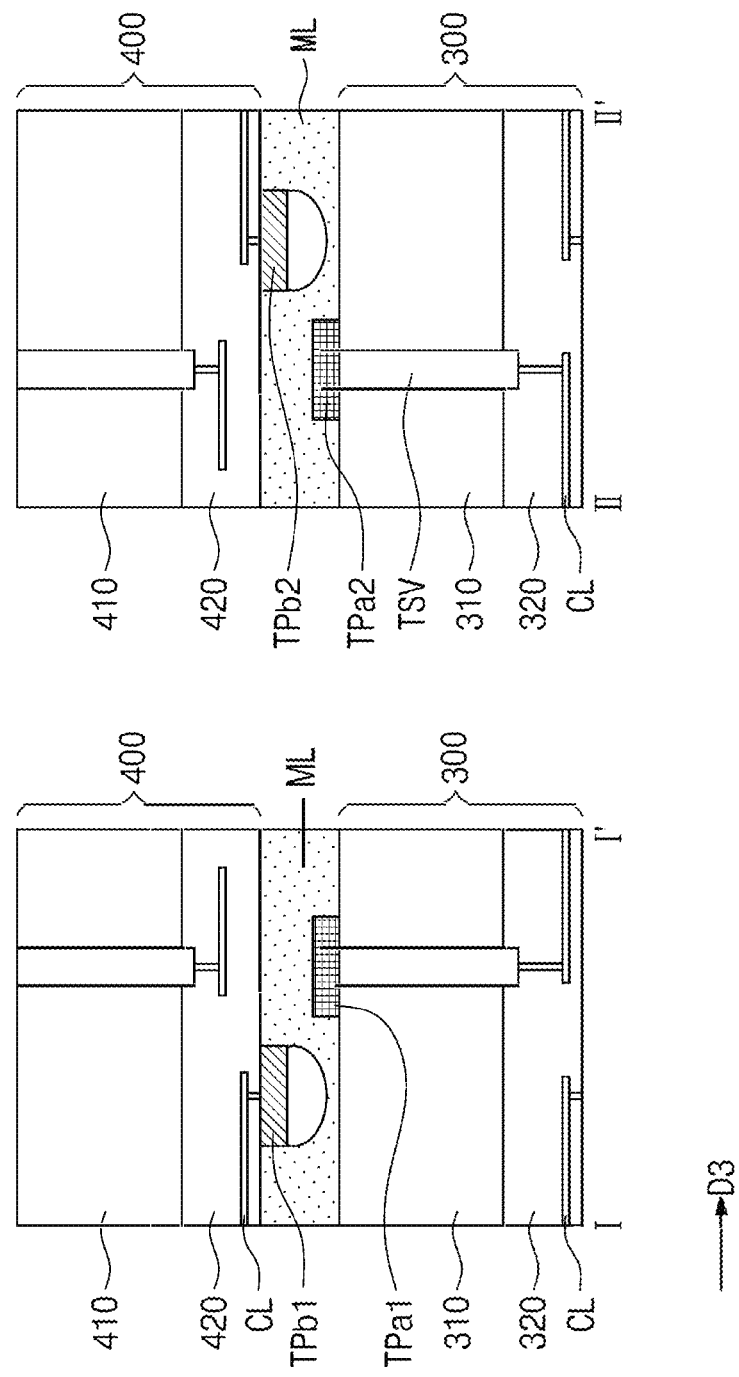
FIG. 8B is a sectional view taken along lines I-I' and II-II' of FIG. 8A.

FIG. 8A is an enlarged plan view illustrating portions BB and CC of FIG. 1. FIG. 8B is a sectional view taken along lines I-I' and II-II' of FIG. 8A.

In detail, referring to FIGS. 1, 8A, and 8B, the dummy pads TP may include a first upper dummy pad TPa1, a second upper dummy pad TPa2, a first lower dummy pad TPb1, and a second lower dummy pad TPb2. The first upper dummy pad TPa1 and the first lower dummy pad TPb1 may be disposed adjacent to each other but may be electrically disconnected from each other. The second upper dummy pad TPa2 and the second lower dummy pad TPb2 may be disposed adjacent to each other but may be electrically disconnected from each other.

The first lower dummy pad TPb1 may be spaced apart from (e.g., isolated from direct contact with) the first upper dummy pad TPa1 in the third direction D3. The second lower dummy pad TPb2 may be spaced apart from (e.g., isolated from direct contact with) the second upper dummy pad TPa2 in an opposite direction of the third direction D3.

Figure 9:
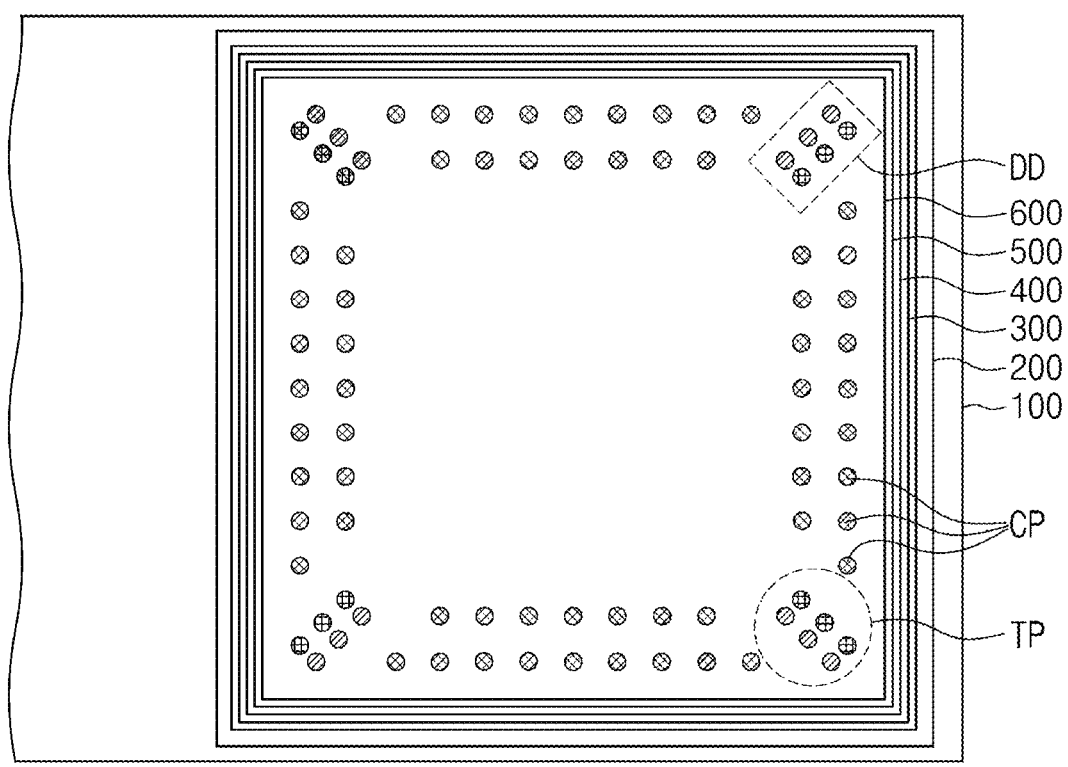
FIG. 9 is a plan view illustrating a semiconductor package according to some example embodiments of the inventive concepts.
Figure 9:
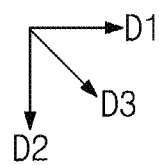
Figure 10:
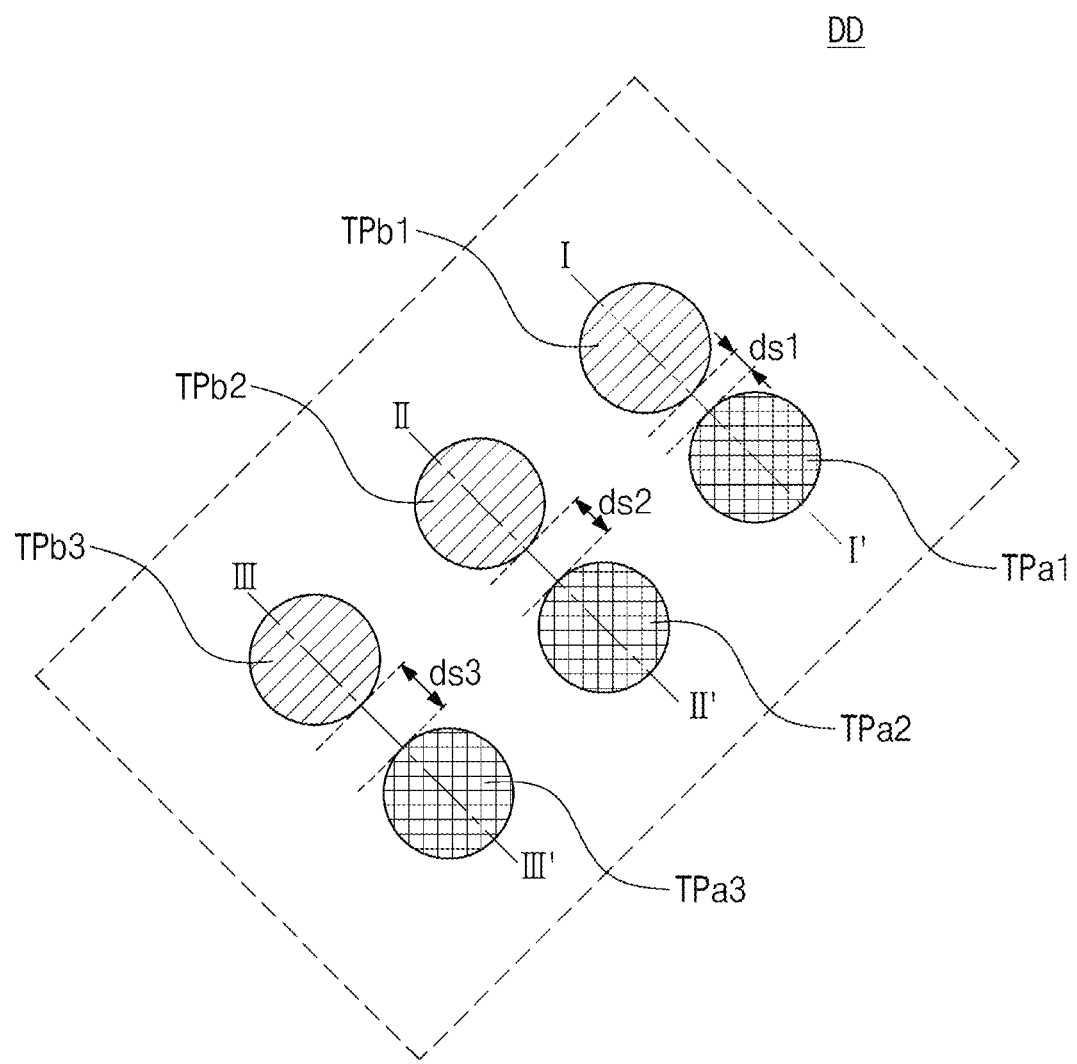
FIG. 10 is an enlarged sectional view illustrating a portion DD of FIG. 9.
Figure 11:
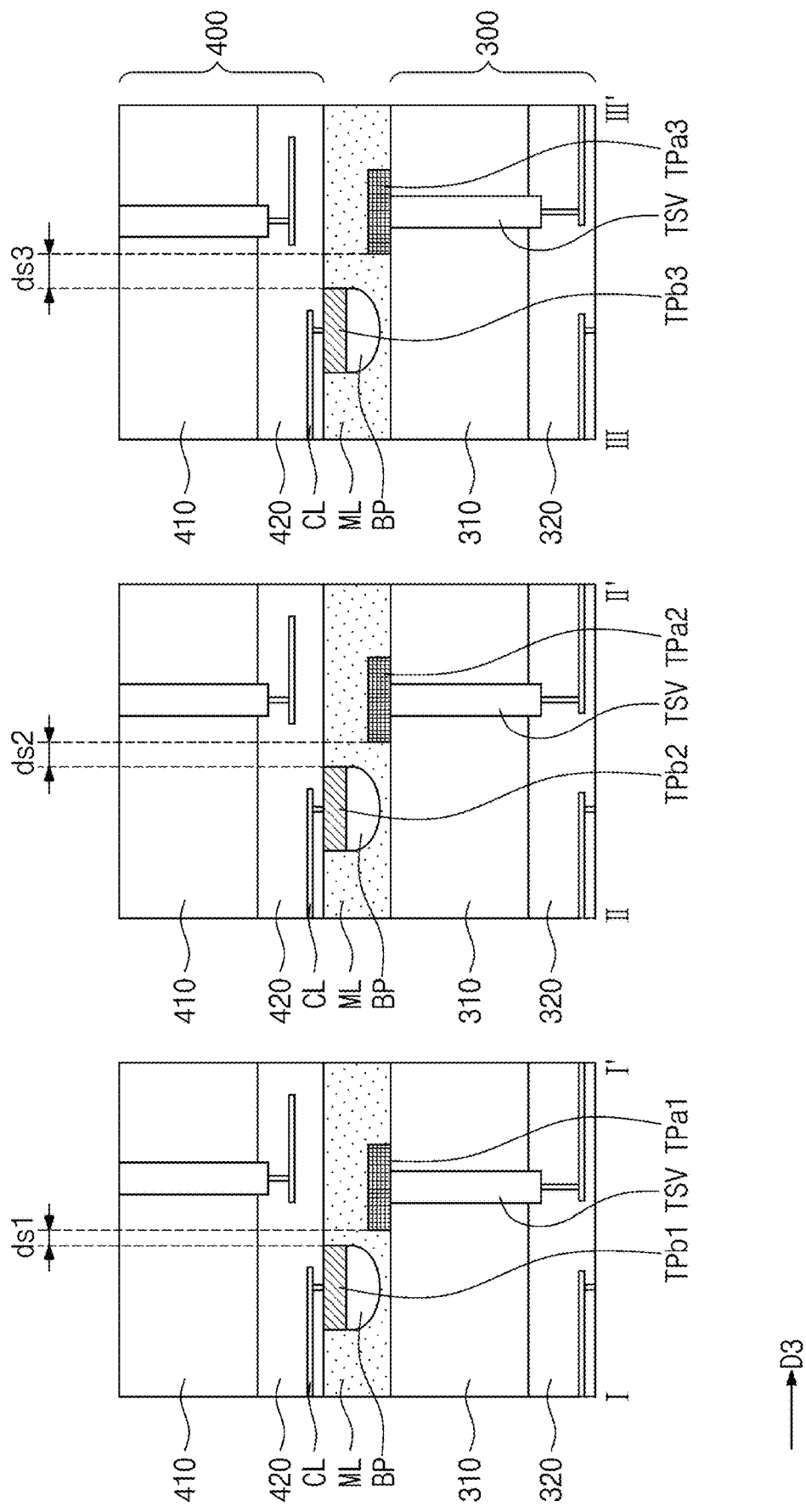
FIG. 11 is a sectional view taken along lines I-I', II-II' and III-III' of FIG. 10.

FIG. 9 is a plan view illustrating a semiconductor package according to some example embodiments of the inventive concepts. FIG. 10 is an enlarged sectional view illustrating a portion DD of FIG. 9. FIG. 11 is a sectional view taken along lines I-I', II-II', and III-III' of FIG. 10.

Referring to FIGS. 9 to 11, the semiconductor package may include the dummy pads TP, which are spaced apart from (e.g., isolated from direct contact with) each other with at least two different distances. In detail, the dummy pads TP may include first to third upper dummy pads TPa1, TPa2, and TPa3 and first to third lower dummy pads TPb1, TPb2, and TPb3. The first upper dummy pad TPa1 and the first lower dummy pad TPb1 may be disposed adjacent to each other. When viewed in a plan view, the first upper dummy pad TPa1 and the first lower dummy pad TPb1 may be spaced apart from (e.g., isolated from direct contact with) each other by a first distance ds1 (e.g., a first horizontal distance). The second upper dummy pad TPa2 and the second lower dummy pad TPb2 may be disposed adjacent to each other. When viewed in a plan view, the second upper dummy pad TPa2 and the second lower dummy pad TPb2 may be spaced apart from (e.g., isolated from direct contact with) each other by a second distance ds2 (e.g., a second horizontal distance). The third upper dummy pad TPa3 and the third lower dummy pad TPb3 may be disposed adjacent to each other. When viewed in a plan view, the third upper dummy pad TPa3 and the third lower dummy pad TPb3 may be spaced apart from (e.g., isolated from direct contact with) each other by a third distance ds3 (e.g., a third horizontal distance). As shown in at least FIG. 10, the first upper dummy pad TPa1 and the first lower dummy pad TPb1 may be spaced apart from (e.g., isolated from direct contact with) each other in a particular horizontal direction (e.g., the third direction D3), the second upper dummy pad TPa2 and the second lower dummy pad TPb2 may be spaced apart from (e.g., isolated from direct contact with) each other in the same particular horizontal direction (e.g., the third direction D3), and the third upper dummy pad TPa3 and the third lower dummy pad TPb3 may be spaced apart from (e.g., isolated from direct contact with) each other in the same particular horizontal direction (e.g., the third direction D3).

The first to third upper dummy pads TPa1, TPa2, and TPa3 may be disposed on the top surface of the first semiconductor chip 300. In some example embodiments, all of the first to third upper dummy pads TPa1, TPa2, and TPa3 may be positioned at the same level or substantially the same level (e.g., the same or substantially same distance in a vertical direction from a top surface of the first substrate 310). The first to third lower dummy pads TPb1, TPb2, and TPb3 may be disposed on the bottom surface of the second semiconductor chip 400. In some example embodiments, all of the first to third lower dummy pads TPb1, TPb2, and TPb3 may be positioned at the same level or substantially the same level (e.g., the same or substantially same distance in a vertical direction from a top surface of the first substrate 310).

It will be understood that elements may be recited herein as being "the same" as other elements, and it will be further understood that elements recited herein as being "the same" as other elements may be "the same" or "substantially the same" as the other elements. Elements that are "substantially the same" as other elements will be understood to include elements that are the same as the other elements within manufacturing tolerances and/or material tolerances. Elements that are the same or substantially the same as other elements may be structurally the same or substantially the same, functionally the same or substantially the same, and/or compositionally the same or substantially the same.

It will be understood that lengths, distances, or the like (e.g., "elements") described herein as being the "substantially" the same encompasses lengths, distances, or the like that are the same within manufacturing tolerances and/or material tolerances and/or lengths, distances, or the like that have a relative difference in magnitude that is equal to or less than 10%. Further, regardless of whether lengths, distances, or the like are modified as "substantially," it will be understood that these lengths, distances, or the like should be construed as including a manufacturing or operational tolerance (e.g., ±10%) around the stated lengths, distances, or the like.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

The second distance ds2 may be larger than the first distance ds1, and the third distance ds3 may be larger than the second distance ds2. Restated, the first horizontal distance (first distance ds1) may be smaller than the second horizontal distance (second distance ds2), and the second horizontal distance (second distance ds2) may be smaller than the third horizontal distance (third distance ds3). For example, the first distance ds1 may range from about 3 μm to about 5 μm. The second distance ds2 may range from about 5 μm to about 7.5 μm. The third distance ds3 may range from about 7.5 μm to about 12 μm. Since the semiconductor package includes the dummy pads TP spaced apart from (e.g., isolated from direct contact with) each other with different distances, the misalignment state between the semiconductor chips may be more precisely measured. For example, if the second lower dummy pad TPb2 and the second upper dummy pad TPa2 are electrically connected to each other and the third lower dummy pad TPb3 and the third upper dummy pad TPa3 are electrically disconnected from each other, it may be determined that the chip misalignment in the third direction D3 is within a range of about 5 μm to about 7.5 μm.

As shown in FIG. 11, bumps BP may be respectively disposed on a bottom surface of the first lower dummy pad TPb1, a bottom surface of the second lower dummy pad TPb2, and a bottom surface of the third lower dummy pad TPb3. As further shown, an insulating layer ML may fill (e.g., entirely fill) a space between the first semiconductor chip 300 and the second semiconductor chip 400, such that the insulating layer ML covers (e.g., directly contacts some or all of, and thus partially or totally isolates from exposure) bottom surfaces of the bumps BP.

Figure 12:
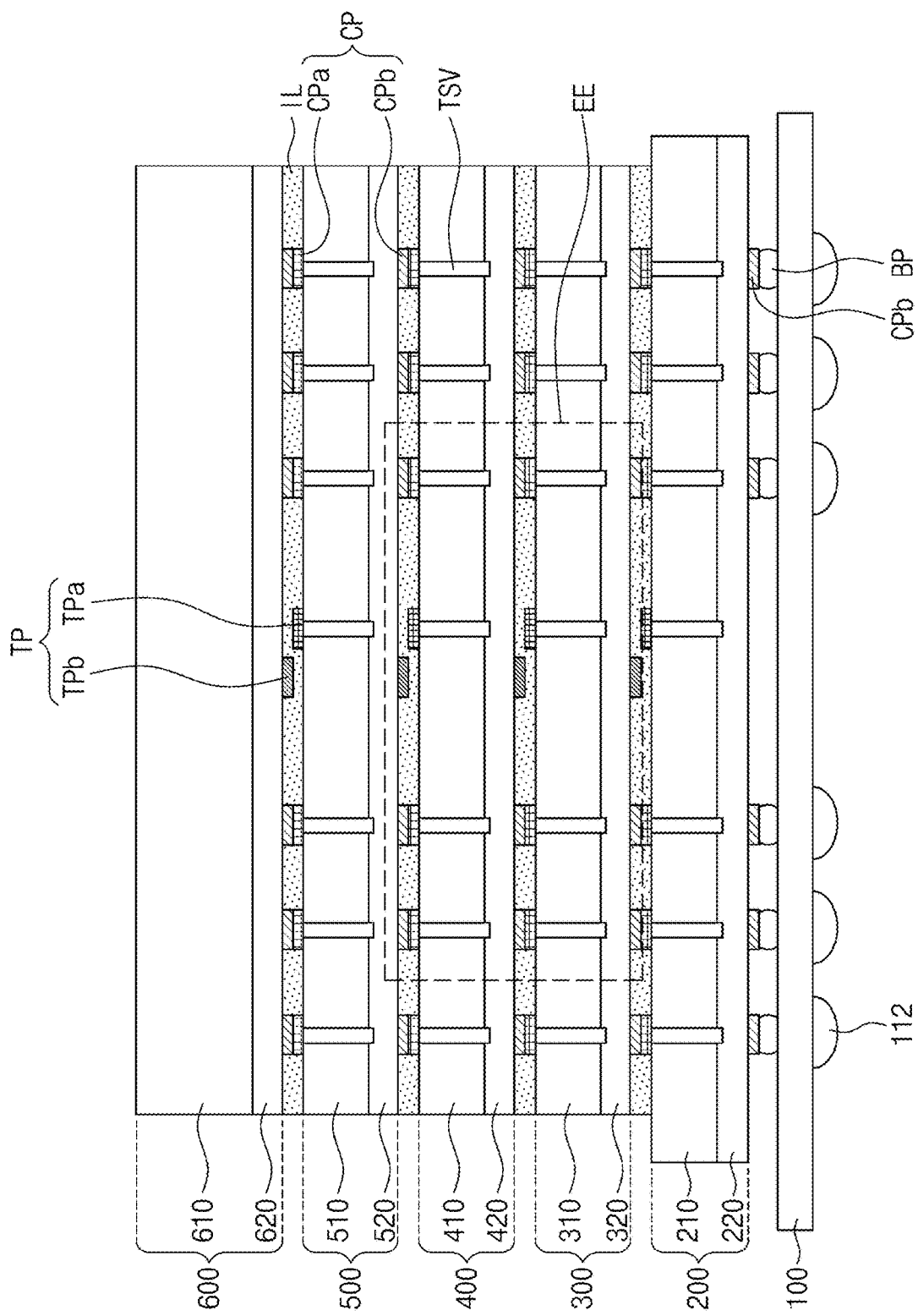
FIG. 12 is a sectional view illustrating a semiconductor package according to some example embodiments of the inventive concepts.
Figure 13:
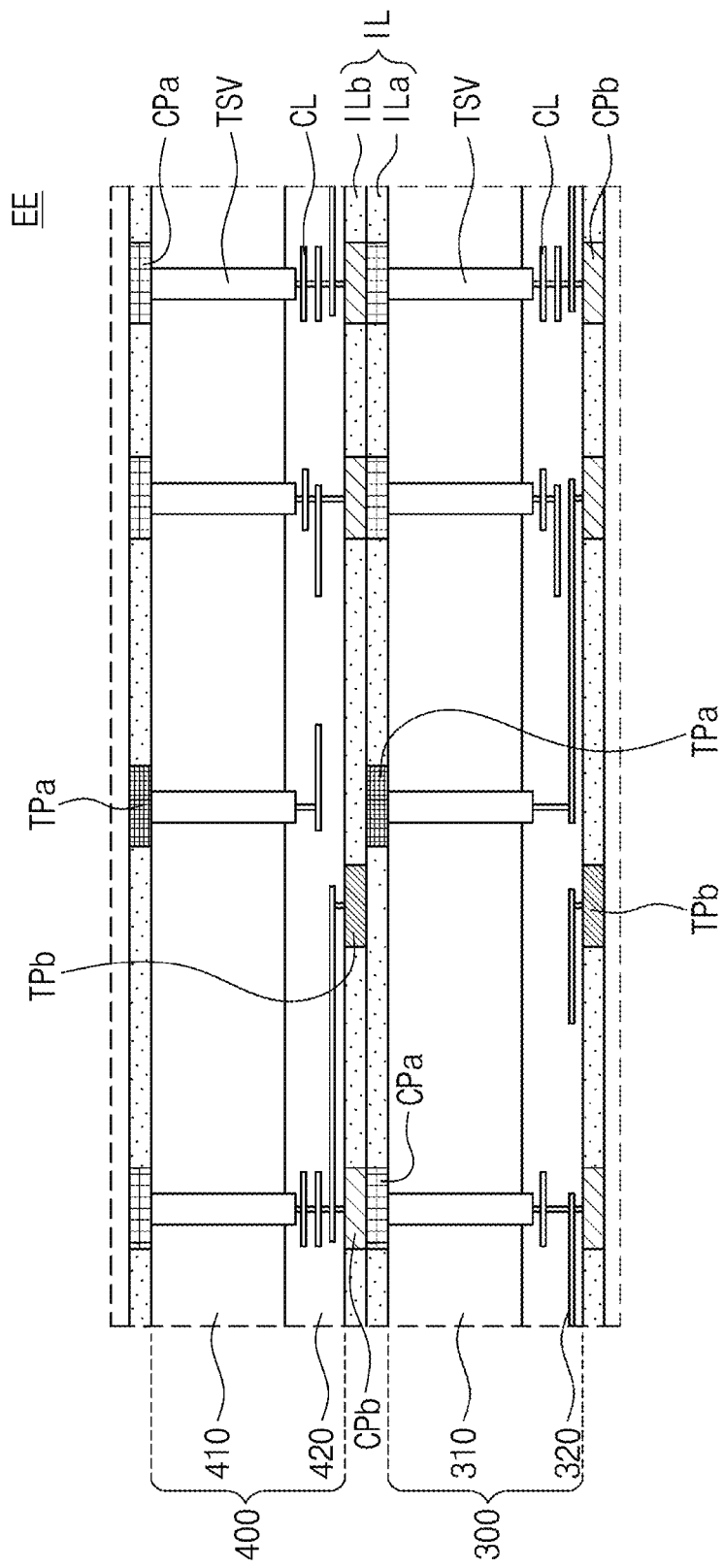
FIG. 13 is an enlarged sectional view illustrating a portion EE of FIG. 12.

FIG. 12 is a sectional view illustrating a semiconductor package according to some example embodiments of the inventive concepts. FIG. 13 is an enlarged sectional view illustrating a portion EE of FIG. 12. For concise description, an element previously described with reference to FIGS. 1 to 11 may be identified by the same reference number without repeating an overlapping description thereof.

Referring to FIGS. 12 and 13, the semiconductor package may not include the bump BP (e.g., see FIG. 1A). According to some example embodiments, the upper chip pads CPa may be in direct contact with the lower chip pads CPb.

An insulating layer IL may include a first insulating layer ILa and a second insulating layer ILb. The first insulating layer ILa and the second insulating layer ILb may include, for example, an adhesive film. The first insulating layer ILa may be formed on the top surface of each of the first to third semiconductor chips 300, 400, and 500 and the buffer chip 200. For example, as shown in FIG. 13, the first insulating layer ILa may be formed on the top surface of the first semiconductor chip 300. The first insulating layer ILa may cover the side surfaces of the upper chip pads CPa but not the top surfaces of the upper chip pads CPa. The second insulating layer ILb may be formed on the bottom surface of each of the first to fourth semiconductor chips 300, 400, 500, and 600. For example, as shown in FIG. 13, the second insulating layer ILb may be formed on the bottom surface of the second semiconductor chip 400. The second insulating layer ILb may cover the side surfaces of the lower chip pads CPb, but not the bottom surfaces of the lower chip pads CPb. The top surfaces of the upper chip pads CPa exposed by the first insulating layer ILa may be in contact with the bottom surfaces of the lower chip pads CPb exposed by the second insulating layer ILb.

The side surfaces of the upper dummy pad TPa may be covered with the first insulating layer ILa, and the top surface of the upper dummy pad TPa may be covered with the second insulating layer ILb. The side surfaces of the lower dummy pad TPb may be covered with the second insulating layer ILb, and the bottom surface of the lower dummy pad TPb may be covered with the first insulating layer ILa. The top surface of the upper dummy pad TPa and the bottom surface of the lower dummy pad TPb may be spaced apart from (e.g., isolated from direct contact with) each other. The top surface of the upper dummy pad TPa and the bottom surface of the lower dummy pad TPb may be positioned at the same level or substantially the same level.

Figure 14:
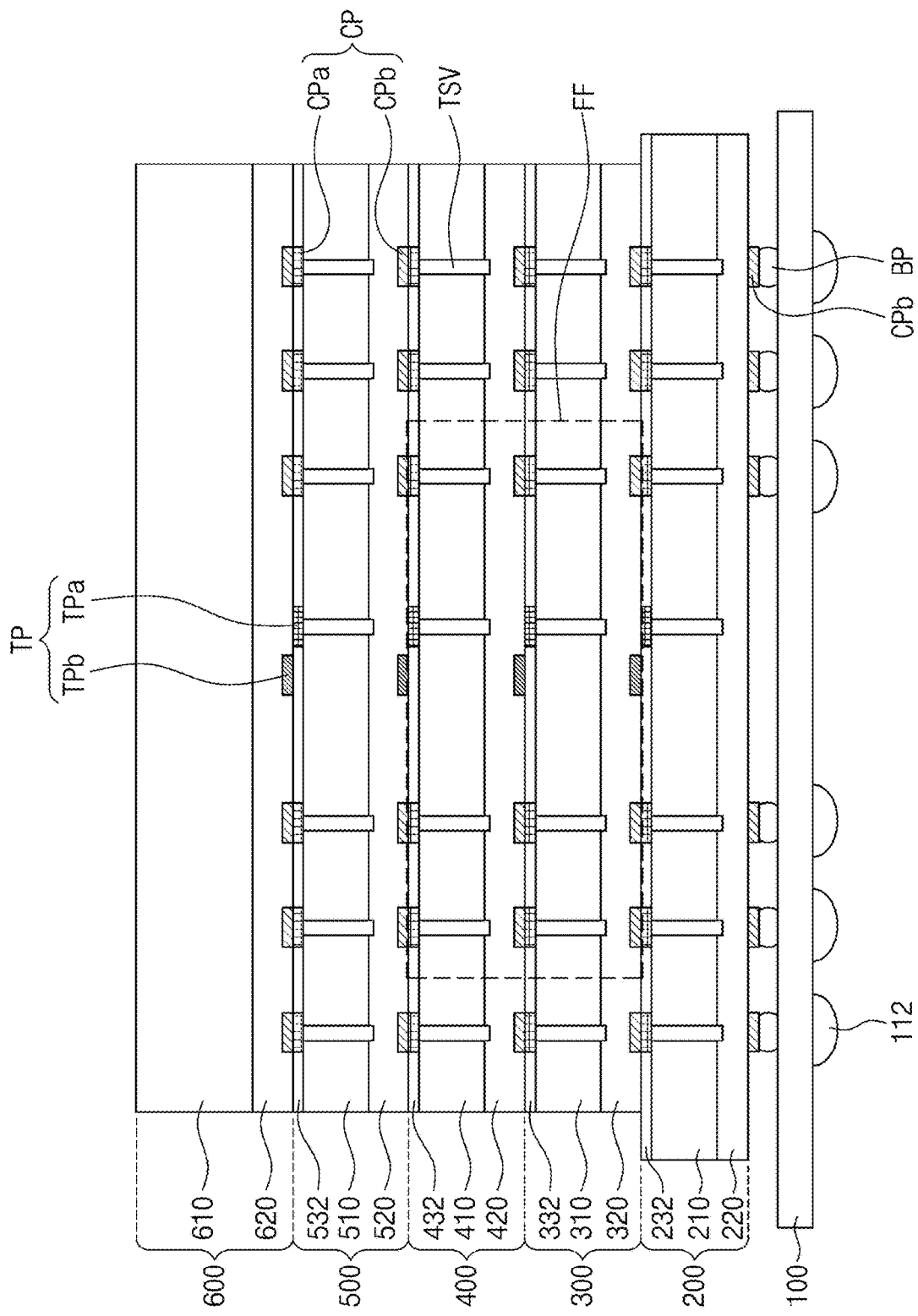
FIG. 14 is a sectional view illustrating a semiconductor package according to some example embodiments of the inventive concepts.
Figure 15:
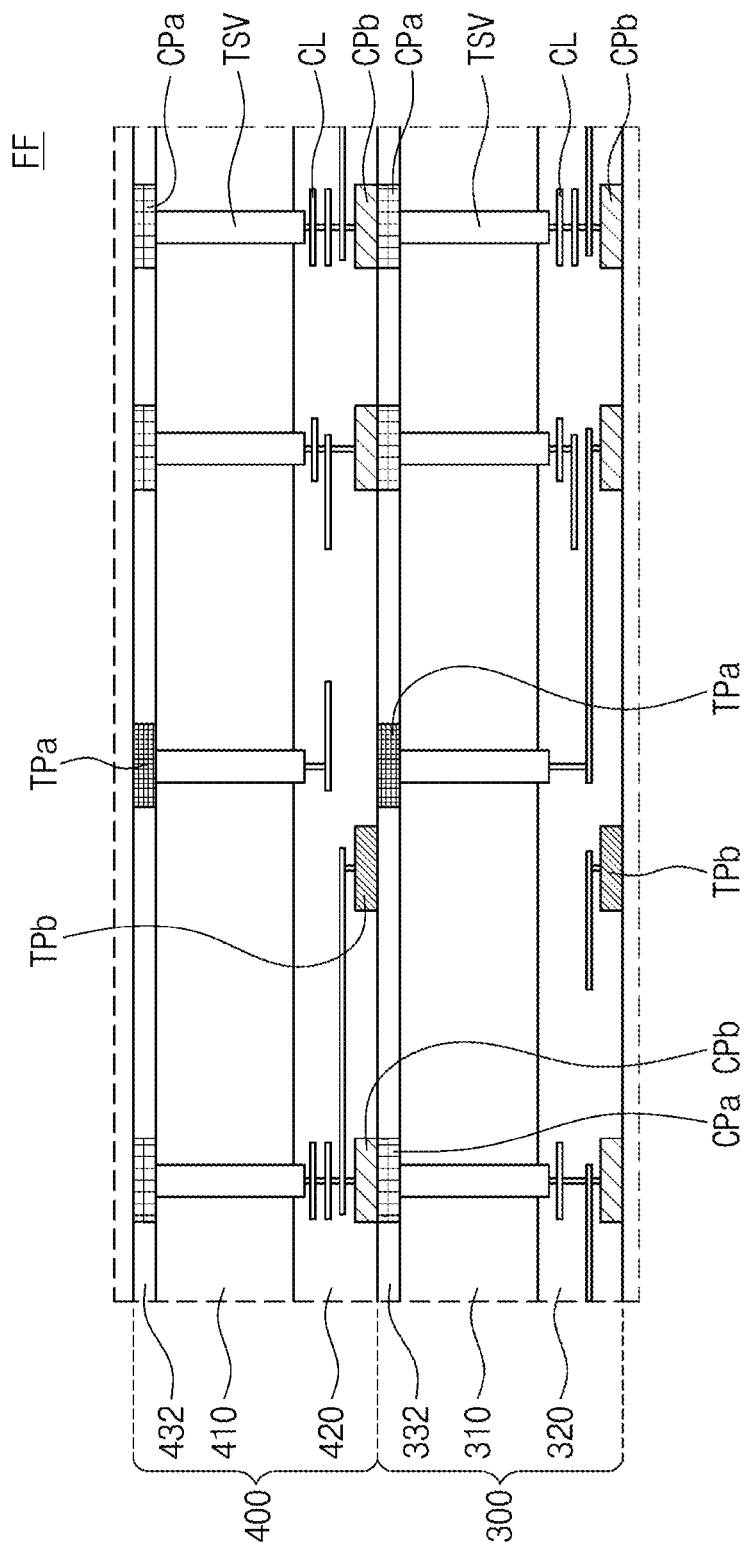
FIG. 15 is an enlarged sectional view illustrating a portion FF of FIG. 14.

FIG. 14 is a sectional view illustrating a semiconductor package according to some example embodiments of the inventive concepts. FIG. 15 is an enlarged sectional view illustrating a portion FF of FIG. 14. For concise description, an element previously described with reference to FIGS. 1 to 11 may be identified by the same reference number without repeating an overlapping description thereof.

Referring to FIGS. 14 and 15, the first to third semiconductor chips 300, 400, and 500 may include first to third upper insulating layers 332, 432, and 532 on the first to third substrates 310, 410, and 510. The buffer chip 200 may include a fourth upper insulating layer 232 on the buffer substrate 210. The first to fourth upper insulating layers 332, 432, 532, and 232 may cover side surfaces of the upper chip pads CPa and side surfaces of the upper dummy pads TPa. The lower chip pads CPb and the lower dummy pads TPb may be buried in the first to fourth semiconductor device layers 320, 420, 520, and 620.

Hereinafter, the first and second semiconductor chips 300 and 400 will be described in more detail. The third and fourth semiconductor chips 500 and 600 may have the same or similar structure as those of the first and second semiconductor chips 300 and 400.

The first semiconductor chip 300 may include the first substrate 310, the first semiconductor device layer 320 on the bottom surface of the first substrate 310, and the first upper insulating layer 332 on the top surface of the first substrate 310. The second semiconductor chip 400 may include the second substrate 410, the second semiconductor device layer 420 on the bottom surface of the second substrate 410, and the second upper insulating layer 432 on the top surface of the second substrate 410.

The first upper insulating layer 332 of the first semiconductor chip 300 may be in direct contact with the second semiconductor device layer 420 of the second semiconductor chip 400. The first and second semiconductor chips 300 and 400 may be bonded to each other by a thermo-compression bonding process. As a result of the thermo-compression bonding process, the first upper insulating layer 332 and the second semiconductor device layer 420 may be bonded to each other, and in some example embodiments, there may be an interface between the first upper insulating layer 332 and the second semiconductor device layer 420. The first upper insulating layer 332 and the second semiconductor device layer 420 may be formed of or include, for example, silicon oxide.

The upper chip pads CPa in the first upper insulating layer 332 and the lower chip pads CPb in the second semiconductor device layer 420 may face each other. The upper and lower chip pads CPa and CPb may be bonded to each other by the thermo-compression bonding process. The upper and lower chip pads CPa and CPb may be formed of or include, for example, copper (Cu). In some example embodiments, the interface between the upper and lower chip pads CPa and CPb may disappear after the thermo-compression bonding process.

The upper dummy pad TPa in the first upper insulating layer 332 and the lower dummy pad TPb in the second semiconductor device layer 420 may be spaced apart from (e.g., isolated from direct contact with) each other in a direction parallel to a top surface of one or more substrates and/or a top surface of one or more semiconductor chips of the semiconductor package (e.g., parallel to a top surface of first substrate 310). The top surface of the upper dummy pad TPa and the bottom surface of the lower dummy pad TPb may be positioned at the same vertical level or substantially the same vertical level. The top surface of the upper dummy pad TPa may be covered with the second semiconductor device layer 420, and the bottom surface of the lower dummy pad TPb may be covered with the first upper insulating layer 332.

According to some example embodiments of the inventive concepts, a semiconductor package, in which a plurality of semiconductor chips are stacked with improved alignment accuracy, is provided. In addition, the semiconductor package may be configured to allow a test operation thereon to be performed in a non-destructive manner.

While some example embodiments of the inventive concepts have been particularly shown and described, it will be understood by one of ordinary skill in the art that variations in form and detail may be made therein without departing from the spirit and scope of the attached claims.

What is claimed is:

1. A method of inspection of a semiconductor package, the method comprising:
   preparing a first semiconductor chip including a first lower chip pad, a second lower chip pad and an upper dummy pad;
   placing a second semiconductor chip including a lower dummy pad on the first semiconductor chip; and
   measuring an alignment accuracy between the first semiconductor chip and the second semiconductor chip,
   wherein the first and second lower chip pads are located on a bottom surface of the first semiconductor chip and spaced apart from each other, wherein the upper dummy pad is located on a top surface of the first semiconductor chip and connected to the second lower chip pad, wherein the lower dummy pad is located on a bottom surface of the second semiconductor chip and connected to the first lower chip pad, and wherein measuring the alignment accuracy includes measuring whether the lower dummy pad and the upper dummy pad are electrically connected.

2. The method of claim 1, wherein measuring whether the lower dummy pad and the upper dummy pad are electrically connected is measuring resistance between the first lower chip pad and the second lower chip pad.

3. The method of claim 1, wherein measuring whether the lower dummy pad and the upper dummy pad are electrically connected is applying a voltage to the first lower chip pad and measuring an output voltage from the second lower chip pad.

4. The method of claim 1, wherein
the first semiconductor chip further includes penetrating electrodes, and
wherein the upper dummy pad is connected to the second lower chip pad through one of the penetrating electrodes.

5. The method of claim 1, wherein
the second semiconductor chip further includes a conductive line, and
the lower dummy pad is connected to the first lower chip pad through the conductive line.

6. The method of claim 1, wherein a bump is located on a bottom surface of the lower dummy pad.

7. The method of claim 1, wherein a diameter of the upper dummy pad is smaller than a diameter of the lower dummy pad.

8. The method of claim 1, wherein a horizontal distance between the upper dummy pad and the lower dummy pad is smaller than a diameter of the lower dummy pad.

9. The method of claim 1, wherein the upper dummy pad and the lower dummy pad are spaced apart from each other in a vertical direction.

10. The method of claim 1, further comprising:
forming an insulating layer between the first semiconductor chip and the second semiconductor chip prior to measuring the alignment accuracy.

11. The method of claim 1, wherein a horizontal distance between the upper dummy pad and the lower dummy pad is 3 μm to 20 μm.

12. The method of claim 1, wherein a horizontal distance between the upper dummy pad and the lower dummy pad is greater than 0.3 and less than 1.0 of a diameter of the upper dummy pad or the lower dummy pad.

13. A method of inspection of a semiconductor package, the method comprising:
preparing a first semiconductor chip including first to third upper dummy pads;
mounting a second semiconductor chip including first to third lower dummy pads on the first semiconductor chip; and
measuring a misalignment between the first semiconductor chip and the second semiconductor chip,
wherein the first upper dummy pad and the first lower dummy pad, the second upper dummy pad and the second lower dummy pad, and the third upper dummy pad and the third lower dummy pad are adjacent to each other, and
wherein measuring the misalignment is respectively measuring whether an electrical connection between the first to third upper dummy pads and the first to third lower dummy pads.

14. The method of claim 13, wherein
a first horizontal distance between the first upper dummy pad and the first lower dummy pad is smaller than a second horizontal distance between the second upper dummy pad and the second lower dummy pad and a third horizontal distance between the third upper dummy pad and the third lower dummy pad, and
the third horizontal distance is greater than the first horizontal distance and the second horizontal distance.

15. The method of claim 14, wherein
the second upper dummy pad and the second lower dummy pad are electrically connected, and the third upper dummy pad and the third lower dummy pad are electrically insulated from each other, and
the misalignment is greater than the second horizontal distance and less than the third horizontal distance.

16. The method of claim 13, wherein the first to third upper dummy pads are on a top surface of the first semiconductor chip.

17. The method of claim 13, wherein the first to third lower dummy pads are on a bottom surface of the second semiconductor chip.

* * * * *